US012787692B2

(12) United States Patent
Mori

(10) Patent No.: US 12,787,692 B2
(45) Date of Patent: Nov. 3, 2026

(54) PROCESSING APPARATUS AND ALIGNMENT METHOD

(71) Applicant: Tokyo Electron Limited, Tokyo (JP)

(72) Inventor: Kiyoshi Mori, Fuchu City (JP)

(73) Assignee: Tokyo Electron Limited, Tokyo (JP)

( * ) Notice: Subject to any disclaimer, the term of this patent is extended or adjusted under 35 U.S.C. 154(b) by 468 days.

(21) Appl. No.: 18/404,980

(22) Filed: Jan. 5, 2024

(65) Prior Publication Data

US 2024/0242988 A1 Jul. 18, 2024

(30) Foreign Application Priority Data

Jan. 16, 2023 (JP) ................................. 2023-004312

(51) Int. Cl.

| | |
|---|---|
| ***H10P 72/00*** | (2026.01) |
| ***H10P 72/30*** | (2026.01) |
| ***H10P 72/50*** | (2026.01) |
| ***H10P 72/76*** | (2026.01) |

(52) U.S. Cl.

CPC ...... *H10P 72/0606* (2026.01); *H10P 72/3302* (2026.01); *H10P 72/53* (2026.01); *H10P 72/7602* (2026.01); *H10P 72/7621* (2026.01)

(58) Field of Classification Search

CPC .. H10P 72/0606; H10P 72/3302; H10P 72/53; H10P 72/7602; H10P 72/7621; H10P 72/0432; H10P 72/0602; H10P 72/0462; H10P 72/3306

See application file for complete search history.

(56) References Cited

U.S. PATENT DOCUMENTS

| | | | | |
|---|---|---|---|---|
| 2021/0013067 A1* | 1/2021 | Carlson | ............... | H10P 72/0464 |
| 2022/0293399 A1* | 9/2022 | Mori | ................... | C23C 16/4584 |
| 2023/0089089 A1* | 3/2023 | Wong | ..................... | G01B 11/24 414/806 |
| 2024/0242988 A1* | 7/2024 | Mori | .................. | H10P 72/0432 |

FOREIGN PATENT DOCUMENTS

| | | | | |
|---|---|---|---|---|
| JP | 2524597 B2 * | 8/1996 | .......... | B23D 59/001 |
| JP | 2022-106560 A | 7/2022 | | |
| JP | 2022112466 A * | 8/2022 | | |

* cited by examiner

*Primary Examiner* — Jeffrie R Lund
(74) *Attorney, Agent, or Firm* — Armstrong Teasdale LLP

(57) ABSTRACT

A processing apparatus includes: a processing container having a plurality of processing spaces formed in the processing container; a rotary arm including a rotational shaft located at a central portion of the processing container and a plurality of end effectors configured to rotate around the rotational shaft and to hold a plurality of wafers which is equal in number to the plurality of processing spaces; and a sensor configured to detect positions of the plurality of end effectors. Among the plurality of end effectors, at least one end effector at a position corresponding to the sensor has a different shape from shapes of other end effectors at the position corresponding to the sensor.

12 Claims, 12 Drawing Sheets

PROCESSING APPARATUS AND ALIGNMENT METHOD

CROSS-REFERENCE TO RELATED APPLICATION

This application is based upon and claims the benefit of priority from Japanese Patent Application No. 2023-004312, filed on Jan. 16, 2023, the entire contents of which are incorporated herein by reference.

TECHNICAL FIELD

The present disclosure relates to a processing apparatus and an alignment method.

BACKGROUND

There is disclosed a substrate processing system in which a processing module includes: a processing container having a plurality of internal processing spaces in which centers thereof are positioned on the same circumference and stages are respectively accommodated; a rotary arm equipped with a plurality of holders capable of holding wafers placed on the stages provided in the plurality of processing spaces and rotatably around a circumferential center as a rotational axis; and a sensor positioned between adjacent processing spaces to detect a position of each wafer held by the rotary arm during the rotation of the rotary arm (Patent Document 1).

PRIOR ART DOCUMENT

Patent Document

Patent Document 1: Japanese Laid-Open Patent Publication No. 2022-106560

SUMMARY

According to one embodiment of the present disclosure, a processing apparatus includes: a processing container having a plurality of processing spaces formed in the processing container; a rotary arm including a rotational shaft located at a central portion of the processing container and a plurality of end effectors configured to rotate around the rotational shaft and to hold a plurality of wafers which is equal in number to the plurality of processing spaces; and a sensor configured to detect positions of the plurality of end effectors, wherein, among the plurality of end effectors, at least one end effector at a position corresponding to the sensor has a different shape from shapes of other end effectors at the position corresponding to the sensor.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments of a substrate processing apparatus and an alignment method disclosed herein will be described in detail with reference to the drawings. In addition, the disclosed technology is not limited by the following embodiments. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a processing apparatus that processes a plurality of wafers simultaneously within one processing container, a plurality of processing spaces may be provided within the processing container, and the wafers may be subjected to different processes in two or more of processing spaces. In such a case, in the processing apparatus, the wafers are delivered between two or more processing spaces. In the processing apparatus configured as above, a technology in which a rotary arm is provided within the processing container to transfer a substrate between two or more processing spaces is considered. In this case, it is necessary to perform alignment, that is, teaching, of a rotational angle of the rotary arm so as to a specified end effector of the rotary arm corresponds to a specified processing space. In the related art, the teaching has been performed visually with an upper portion of the processing container open. However, in a case where X-direction and Y-direction pitches of a plurality of processing spaces are different from each other, it is difficult to visually specify a reference end effector serving as a reference for alignment and to perform the alignment of the rotational angle of the rotary arm. Accordingly, there is a need to facilitate the alignment of the end effector.

[Configuration of Substrate Processing System]

Figure 1:
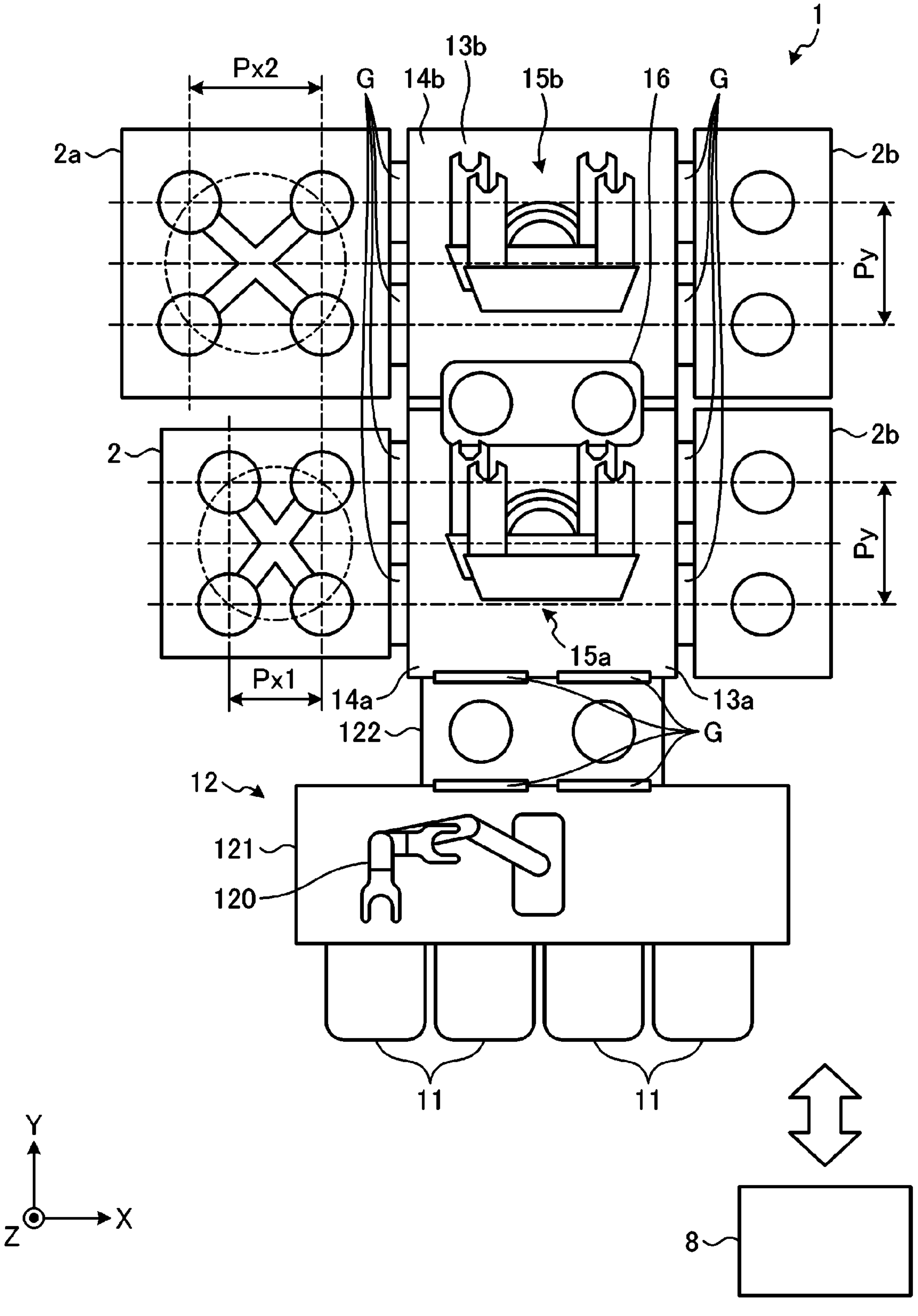
FIG. 1 is a schematic plan view illustrating an example of a configuration of a substrate processing system according to one embodiment of the present disclosure.

FIG. 1 is a schematic plan view illustrating an example of a configuration of a substrate processing system according to one embodiment of the present disclosure. A substrate processing system 1 illustrated in FIG. 1 includes a loading/unloading port 11, a loading/unloading module 12, vacuum transfer modules 13*a* and 13*b*, and substrate processing apparatuses 2, 2*a* and 2*b*. In FIG. 1, an X-direction will be referred to as a left-right direction, a Y-direction will be referred to as a front-back direction, a Z-direction will be referred to as an up-down direction (height direction), and the loading/unloading port 11 will be referred to as a front side of the front-back direction. The loading/unloading port 11 and the vacuum transfer module 13*a* are connected to a front side and a back side of the loading/unloading module 12 in the front-back direction, respectively.

A carrier, which is a transfer container in which a substrate to be processed is accommodated, is placed on the loading/unloading port 11. The substrate is a wafer W, which is a circular substrate with a diameter of, for example, 300 mm. The loading/unloading module 12 serves to load and unload the wafer W between the carrier and the vacuum transfer module 13*a*. The loading/unloading module 12 includes a normal-pressure transfer chamber 121 where a transfer mechanism 120 delivers the wafer W to and from the carrier under a normal pressure atmosphere, and a load-lock chamber 122 where the wafer W is switched between the normal pressure atmosphere and a vacuum atmosphere.

The vacuum transfer modules 13*a* and 13*b* include vacuum transfer chambers 14*a* and 14*b* which are kept in the vacuum atmosphere, respectively. Substrate transfer mechanisms 15*a* and 15*b* are arranged inside the vacuum transfer chambers 14*a* and 14*b*, respectively. A path 16 is provided between the vacuum transfer module 13*a* and the vacuum transfer module 13*b* to deliver the wafer W between the vacuum transfer modules 13*a* and 13*b*. Each of the vacuum transfer chambers 14*a* and 14*b* is formed, for example, in a rectangular shape in a plan view. Sides facing each other in the left-right direction, among four sidewalls of the vacuum transfer chamber 14*a*, are connected to the substrate processing apparatuses 2 and 2*b*, respectively. Sides facing each other in the left-right direction, among four sidewalls of the vacuum transfer chamber 14*b*, are connected to the substrate processing apparatuses 2*a* and 2*b*, respectively.

A side at the front side, among four sidewalls of the vacuum transfer chamber 14*a*, is connected to the load-lock chamber 122 provided in the loading/unloading module 12. Gate valves G are arranged between the normal-pressure transfer chamber 121 and the load-lock chamber 122, between the load-lock chamber 122 and the vacuum transfer module 13*a*, and between the vacuum transfer modules 13*a* and 13*b* and the substrate processing apparatuses 2, 2*a* in and 2*b*. The gate valves G open and close loading/unloading ports for the wafer W provided respectively in the modules connected to each other.

The substrate transfer mechanism 15*a* transfers the wafer W between the loading/unloading module 12, the substrate processing apparatuses 2 and 2*b*, and the path 16 under the vacuum atmosphere. Further, the substrate transfer mechanism 15*b* transfers the wafer W between the path 16 and the substrate processing apparatuses 2*a* and 2*b* under the vacuum atmosphere. The substrate transfer mechanisms 15*a* and 15*b* are constituted with multi-joint arms and include substrate holders that hold the wafer W. The substrate processing apparatuses 2, 2*a* and 2*b* perform batch-type substrate processing on a plurality of (for example, two or four) wafers W with processing gases under the vacuum atmosphere. Therefore, the substrate holders of the substrate transfer mechanisms 15*a* and 15*b* are configured to simultaneously hold, for example, two wafers W, so as to transfer the two wafers W to the substrate processing apparatuses 2, 2*a* and 2*b* in a batch manner. In addition, the substrate processing apparatuses 2 and 2*a* may transfer, by rotary arms provided therein, the wafers W received from a stage at the side of the vacuum transfer module 13*a* or 13*b* to a stage provided the back side. Further, the substrate processing apparatuses 2 and 2*a* may detect, by sensors provided therein, positions of the wafers W during the transfer of the wafers W by the rotary arms.

Further, in the substrate processing apparatuses 2, 2*a* and 2*b*, a Y-direction pitch (row distance) between the stages are identical to each other as a pitch Py. Thus, the substrate processing apparatuses 2, 2*a* and 2*b* may be connected to any location on opposing sides of the vacuum transfer modules 13*a* and 13*b* in the left-right direction. In the example of FIG. 1, the substrate processing apparatus 2 and the substrate processing apparatus 2*b* are connected to the vacuum transfer module 13*a*, while the substrate processing apparatus 2*a* and the substrate processing apparatus 2*b* are connected to the vacuum transfer module 13*b*. In addition, the substrate processing apparatuses 2 and 2*a* have different diameters of reactors (processing containers) including a processing space corresponding to one stage, and also have different X-direction pitches (column distances) between the stages, which are denoted as pitches Px1 and Px2, depending on process applications. Further, in the substrate processing apparatus 2*a*, the pitch Px2 is equal to the pitch Py. In other words, the pitch Py corresponds to a size of the largest reactor. That is, since the substrate processing apparatus 2 has a smaller reactor size than the substrate processing apparatus 2*a*, the pitch Px1 may be smaller than the pitch Px2.

In addition, the substrate processing apparatus 2*b* is configured to include two stages. Two wafers are loaded, processed, and then unloaded in a simultaneous manner without the transfer of the wafers within the substrate processing apparatus 2*b*.

The substrate processing system 1 includes a controller 8. The controller 8 is, for example, a computer provided with a processor, a storage, an input device, a display device, and the like. The controller 8 controls each part of the substrate processing system 1. The controller 8 may allow an operator to input commands using the input device in order to manage the substrate processing system 1. Further, the controller 8 may cause the display device to visually display an operational status of the substrate processing system 1. Further, the storage of the controller 8 stores control programs, pieces of recipe data, and the like for controlling, by the processor, various processes executed in the substrate processing system 1. The processor of the controller 8 executes the control programs to control each part of the substrate processing system 1 according to the pieces of recipe data, so that the substrate processing system 1 executes a desired substrate processing.

[Configuration of Substrate Processing Apparatus]

Figure 2:
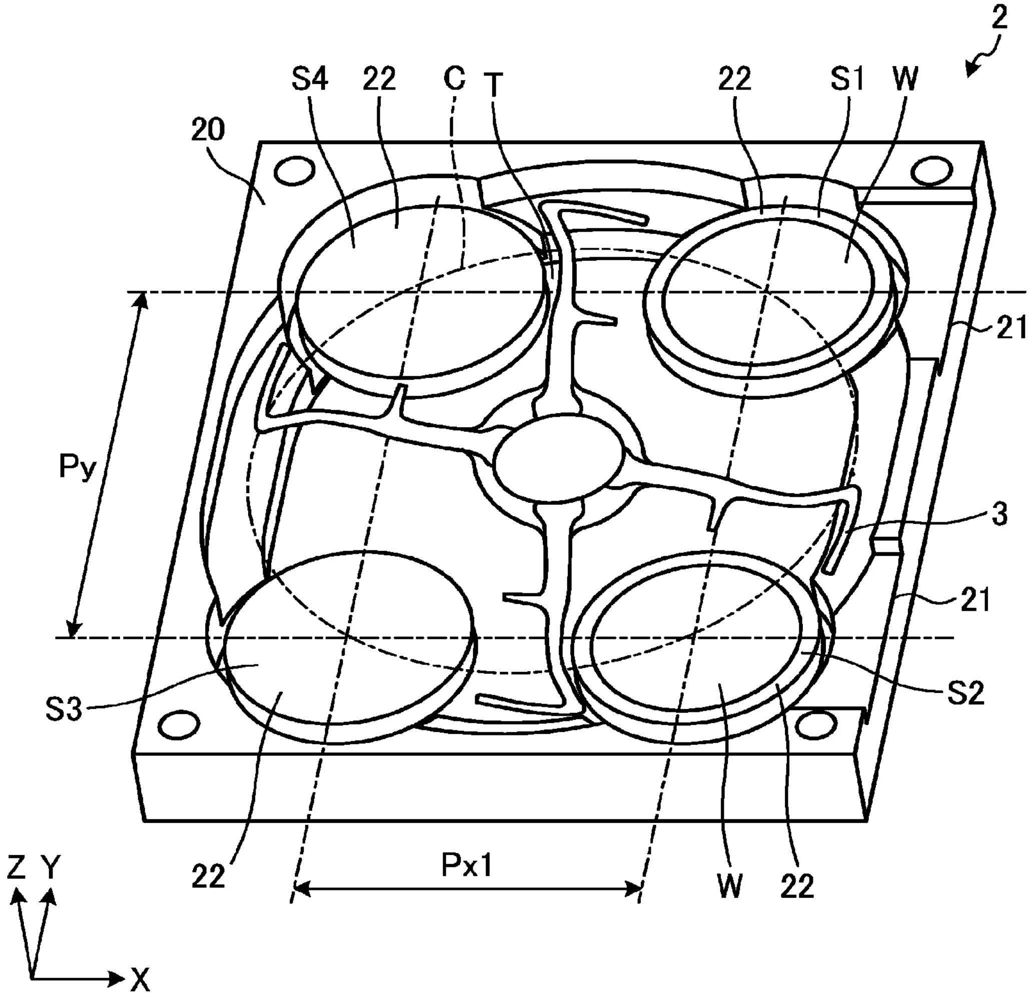
FIG. 2 is an exploded perspective view illustrating an example of a configuration of a substrate processing apparatus according to the present embodiment.

Next, an example where the substrate processing apparatuses 2 and 2*a* are applied to, for example, a film forming apparatus that performs a plasma chemical vapor deposition (CVD) process on the wafer W, will be described with reference to FIGS. 2 to 13. FIG. 2 is an exploded perspective view illustrating an example of a configuration of a substrate processing apparatus according to the present embodiment. In addition, an internal configuration of the substrate processing apparatus 2*a* is basically similar to that of the substrate processing apparatus 2, except for the pitch Px2 different from the pitch Px1 and arrangement positions of sensors capable of detecting the position of the wafer W. Therefore, in the following, a redundant description of the substrate processing apparatus 2*a* in relation to the substrate processing apparatus 2 will be omitted, and the substrate processing apparatus 2 will be described as a representative example. The substrate processing apparatuses 2 and 2*a* are examples of processing modules.

As illustrated in FIG. 2, the substrate processing apparatus 2 includes a processing container (vacuum container) 20 having a rectangular shape in a plan view. The processing container 20 is configured to keep an interior thereof under the vacuum atmosphere. An upper opening of the processing container 20 is sealed with a gas supplier 4 and a manifold 36, which will be described later. In addition, in FIG. 2, internal partitions and the like are omitted for the clarification of a relationship between a plurality of processing spaces S1 to S4 and a rotary arm 3. The processing container 20 includes two loading/unloading ports 21 which are formed to be arranged in the Y direction at a side connected to the vacuum transfer chamber 14*a* or 14*b*. The loading/unloading ports 21 are opened and closed by the gate valves G.

The plurality of processing spaces S1 to S4 are provided in the interior of the processing container 20. A stage 22 is disposed in each of the processing spaces S1 to S4. The stage 22 is movable in the vertical direction. The stage 22 moves upward during the processing of the wafer W and moves downward during the transfer of the wafer W. A transfer space T where the wafer W is transferred by the rotary arm 3, is provided below the processing spaces S1 to S4 to interconnect the processing spaces S1 to S4. Further, the transfer space T below the processing spaces S1 and S2 is connected to each loading/unloading port 21, and the wafer W is loaded and unloaded between the transfer space T and the vacuum transfer chamber 14*a* or 14*b* by the substrate transfer mechanism 15*a* or 15*b*.

The plurality of processing spaces S1 to S4 have centers positioned on the same circumference C, respectively. The center of the circumference C coincides with the center of the substrate processing apparatus 2, that is, the center of the processing container 20. In other words, the plurality of processing spaces S1 to S4 are arranged on the circumference C with the processing container 20 sharing a common center when viewed from the top side.

The respective stages 22 in the processing spaces S1 to S4 are laid out in two rows and two columns when viewed from the top side. This layout has different dimensions for the row distance and column distance. In other words, when comparing the Y-direction pitch (row distance) denoted as the pitch Py and the X-direction pitch (column distance) denoted as the pitch Px1 for the stages 22, the pitch Py is larger than the pitch Px1.

Figure 3:
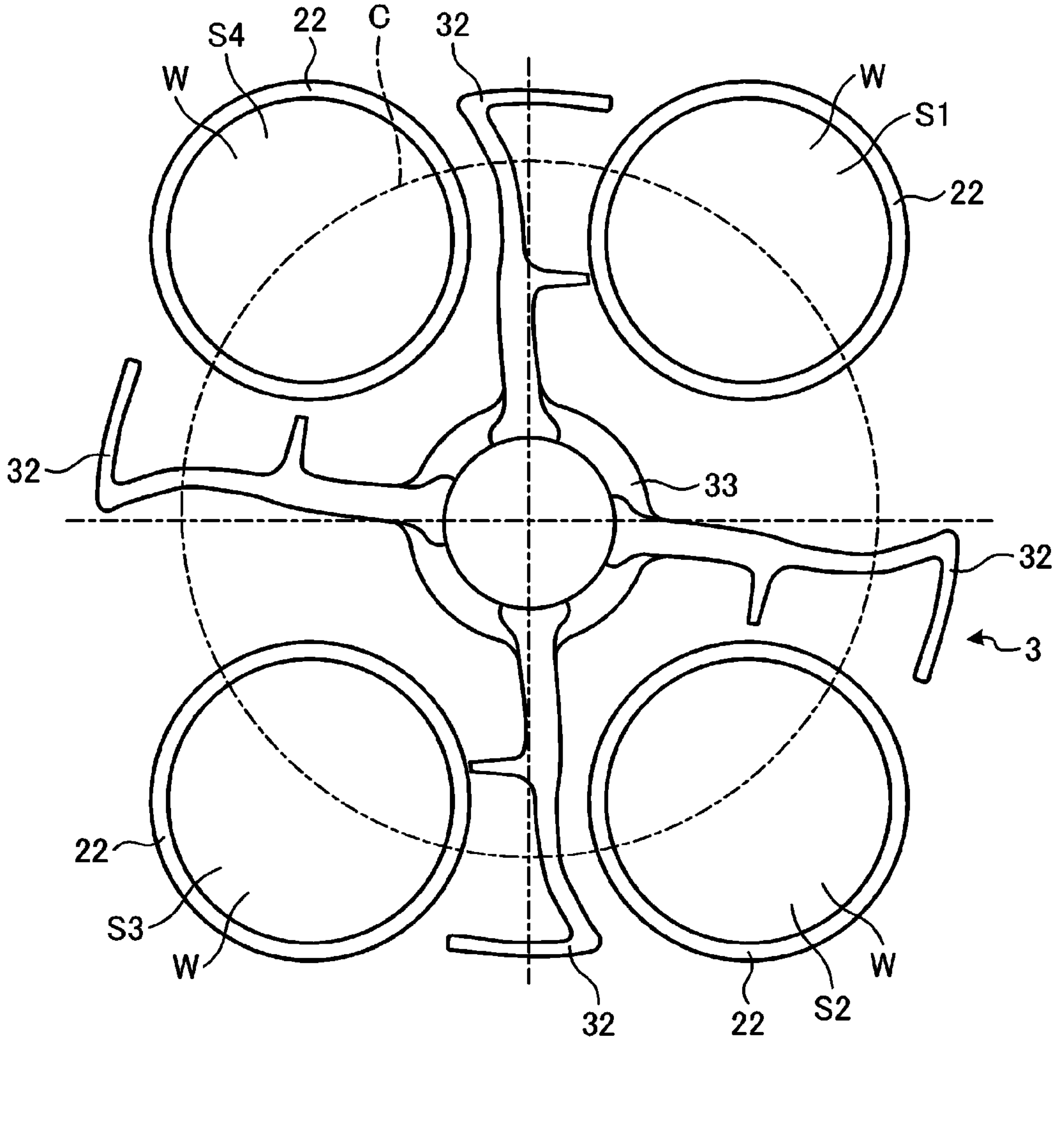
FIG. 3 is a diagram illustrating an example of a positional relationship between a processing space and a rotary arm at a standby position.
Figure 4:
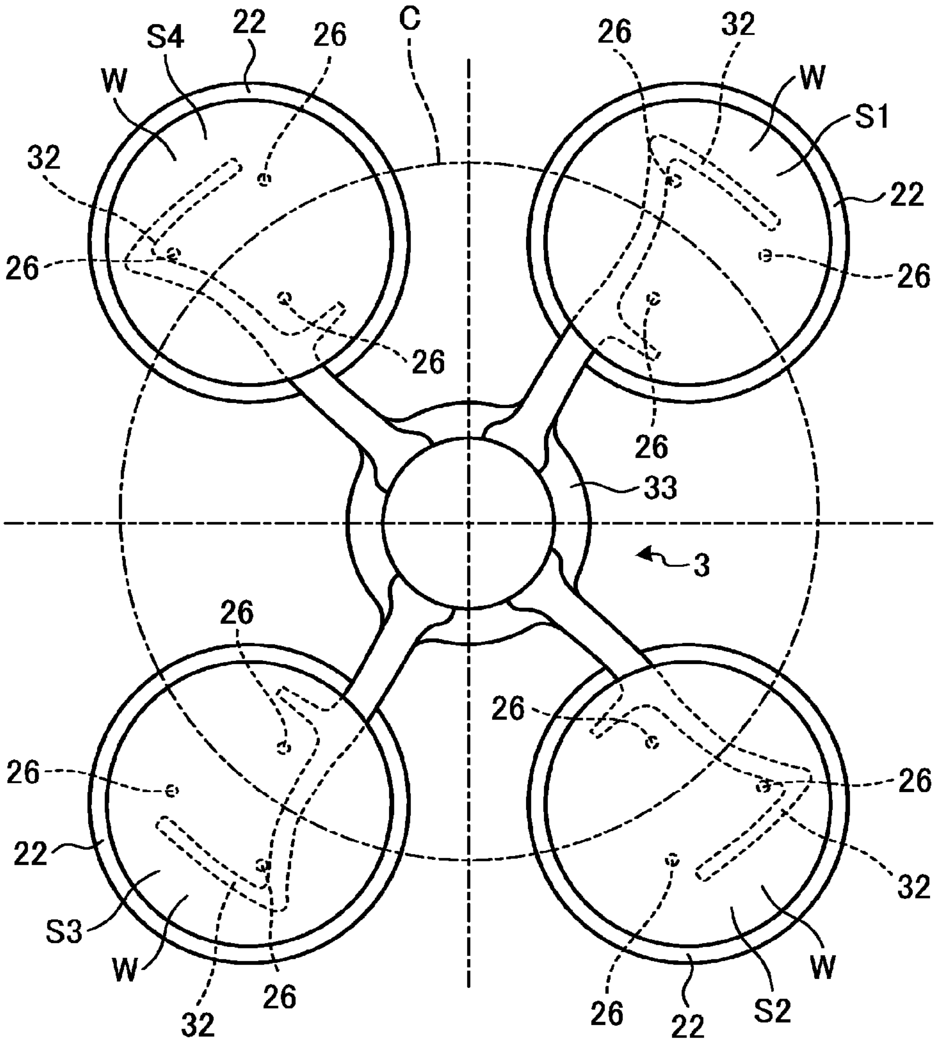
FIG. 4 is a diagram illustrating an example of a positional relationship between the processing space and the rotary arm at a wafer holding position.

FIG. 3 is a diagram illustrating an example of a positional relationship between the processing space and the rotary arm at a standby position. FIG. 4 is a diagram illustrating an example of a positional relationship between the processing space and the rotary arm at a wafer holding position. As illustrated in FIGS. 3 and 4, the rotary arm 3 includes four end effectors 32 capable of holding the wafers W placed on the respective stages 22 and a base member 33 having a rotational shaft located at the position of the center of the circumference C, so that the rotary arm 3 is rotatably provided about the center of the circumference C as a rotational axis. The four end effectors 32 are connected to the base member 33 to form an X shape. In the X shape of the rotary arm 3, a Y-direction dimension corresponding to the row distance and an X-direction dimension corresponding to the column distance of the X shape at the wafer holding position illustrated in FIG. 4 are different from each other.

In other words, two sets of end effectors 32 are arranged so that two end effectors are provided to face each other around the rotational shaft, and distances between adjacent end effectors at front and back sides in a rotational direction (the Y-direction dimension and the X-direction dimension) are different from each other. In addition, in the substrate processing apparatus 2*a*, two sets of end effectors 32 are arranged so that two end effectors are provided to face each other around the rotational shaft, and distances between adjacent end effectors 32 at front and back sides in a rotational direction (the Y-direction dimension and the X-direction dimension) are identical to each other.

At the standby position illustrated in FIG. 3, the rotary arm 3 is located between the respective processing spaces S1 to S4 so as not to interfere with the vertical movement of the respective stages 22. In FIG. 3, the wafers W are in the state of being placed on the respective stages 22. In this state, in a case of transferring the wafers to exchange, for example, a first column of wafer W with a second column of wafer W, that is, a case of transferring the wafers W in the processing spaces S1 and S2 to the processing spaces S3 and S4 and transferring the wafers W in the processing spaces S3 and S4 to the processing spaces S1 and S2, a motion of the rotary arm 3 will be described later.

First, each stage 22 is moved to the delivery position in the transfer space T at the lower side, and lift pins 26 (to be described later) provided on each stage 22 are raised to lift the wafer W. Subsequently, the rotary arm 3 is rotated clockwise by about 30 degrees to insert each end effector 32 between the stage 22 and the wafer Was illustrated in FIG. 4. Subsequently, the lift pins 26 are lowered to place the wafer W on each end effector 32. Subsequently, the rotary arm 3 is rotated clockwise by 180 degrees to transfer the wafer W to the wafer holding position above each stage 22. Once each stage 22 has received the wafer W by raising the lift pins 26, the rotary arm 3 is rotated counterclockwise by about 30 degrees to move to the standby position. In this way, the rotary arm 3 may transfer the first column of wafer W and the second column of wafer W to exchange them. Thus, for example, when different processes (for example, film formation and annealing) are performed in the processing spaces S1 and S2 and in the processing spaces S3 and S4, respectively, the rotary arm 3 may transfer the wafers W between the processing spaces S1 and S2 and the processing spaces S3 and S4. Accordingly, for example, when different processes are repeated in the processing spaces S1 and S2 and in the processing spaces S3 and S4 (for example, when the film formation and the annealing are repeated), a time required for the transfer of the wafers W may be shortened.

Figure 5:
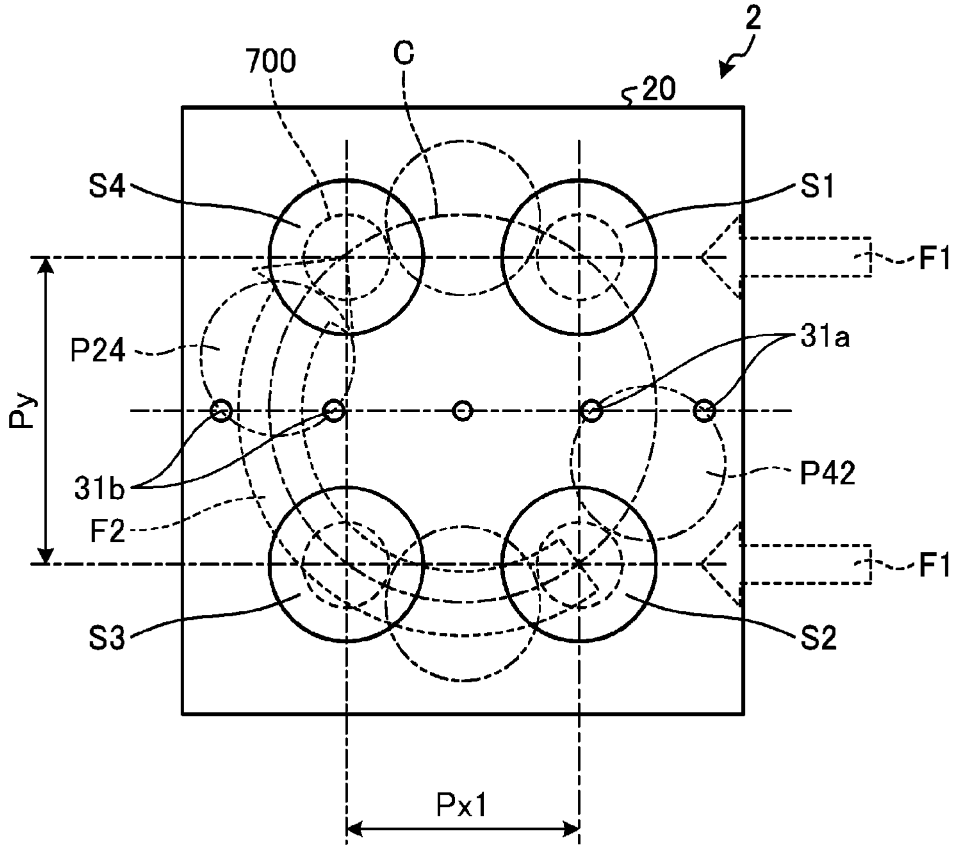
FIG. 5 is a diagram illustrating an example of a wafer movement path within the substrate processing apparatus according to the present embodiment.

FIG. 5 is a diagram illustrating an example of a wafer movement path within the substrate processing apparatus according to the present embodiment. In FIG. 5, the wafer movement path when transferring the wafers W from the vacuum transfer chamber 14*a* to the interior of the substrate processing apparatus 2 will be described. First, as represented by a path F1, the substrate transfer mechanism 15*a* in the vacuum transfer chamber 14*a* simultaneously loads two wafers W onto the respective stages 22 at the delivery position in the transfer space T below the processing spaces S1 and S2 corresponding to the stages 22 in the same column. The respective stages 22 in the processing spaces S1 and S2 raise the lift pins 26 to receive the wafers W.

Subsequently, the rotary arm 3 is rotated clockwise by about 30 degrees from the standby position to insert the end effectors 32 between the wafers W and the stages 22 at the delivery position below the processing spaces S1 and S2, and the lift pins 26 are lowered to place the wafers W on the respective end effectors 32. When the wafers W are placed, as represented by path F2, the rotary arm 3 is rotated clockwise by 180 degrees to transfer the wafers W above the stages 22 (holding position of the rotary arm 3) at the delivery position in the transfer space T below the processing spaces S3 and S4. When the stages 22 at the delivery position below the processing spaces S3 and S4 receive the wafers W by raising the lift pins 26, the rotary arm 3 is rotated counterclockwise by about 30 degrees to move to the standby position. In this state, no wafer is placed on the stages 22 in the processing spaces S1 and S2, while the wafers W are placed on the stages 22 in the processing spaces S3 and S4. Subsequently, as represented by path F1, the substrate transfer mechanism 15*a* in the vacuum transfer chamber 14*a* simultaneously loads two wafers W onto the respective stages 22 at the delivery position below the processing spaces S1 and S2, and the wafers W are placed on the stages 22 in the processing spaces S1 and S2. In this way, the wafers W are placed on all of the stages 22 in the processing spaces S1 to S4.

Similarly, during unloading, first, the wafers W placed on the stages 22 at the delivery position below the processing spaces S1 and S2 are unloaded to the vacuum transfer chamber 14*a* by the substrate transfer mechanism 15*a*. Subsequently, the wafers W placed on the stages 22 at the delivery position below the processing spaces S3 and S4 are transferred to the stages 22 at the delivery position below the processing spaces S1 and S2 by the rotary arm 3. Subsequently, the wafers W placed on the stages 22 at the delivery position below the processing spaces S1 and S2 are unloaded to the vacuum transfer chamber 14*a* by the substrate transfer mechanism 15*a*. In this way, the wafers W may be loaded and unloaded into and from the processing spaces S1 to S4 by using the substrate transfer mechanism 15*a* capable of loading and unloading two wafers W simultaneously, as well as the rotary arm 3.

However, during the transfer of the wafers W by the rotary arm 3 within the processing container 20, the positions of the wafers W may be displaced from a predetermined reference position (for example, the center positions of the processing spaces S1 to S4 as transfer destinations) due to misalignment of the wafers at the delivery position, vibrations of the rotary arm 3 or the like. The displacement of the wafers W may deteriorate the uniformity of processing in the processing spaces S1 to S4.

To address this, the substrate processing apparatus 2 detects the positions of the wafers W during the transfer of the wafers W by the rotary arm 3. Specifically, the substrate processing apparatus 2 includes sensors located between adjacent processing spaces S1 to S4 to detect the positions of the wafers W held by the rotary arm 3 during the rotation of the rotary arm 3. In the example of FIG. 5, the substrate processing apparatus 2 includes sensors 31*a* and 31*b* located respectively between adjacent processing spaces S1 and S2 and between adjacent processing spaces S3 and S4.

Each of the sensors 31*a* and 31*b* is, for example, a set of two unit sensors, and is arranged on a straight line in the X-direction passing through the center of the substrate processing apparatus 2 (the processing container 20), that is, the center position of the circumference C. The two unit sensors of each of the sensors 31*a* and 31*b* are arranged on the straight line in the X-direction passing through the center position of the circumference C so that the arc of the circumference C is positioned between the two unit sensors. This is to align the arrangement direction of the two unit sensors of each of the sensors 31*a* and 31*b* with a thermal expansion direction of the processing container 20, thereby minimizing detection errors caused by a change in a positional relationship between the two unit sensors during thermal expansion. Examples of the two unit sensors of each of the sensors 31*a* and 31*b* may include optical sensors and millimeter-wave-type sensors.

Figure 6:
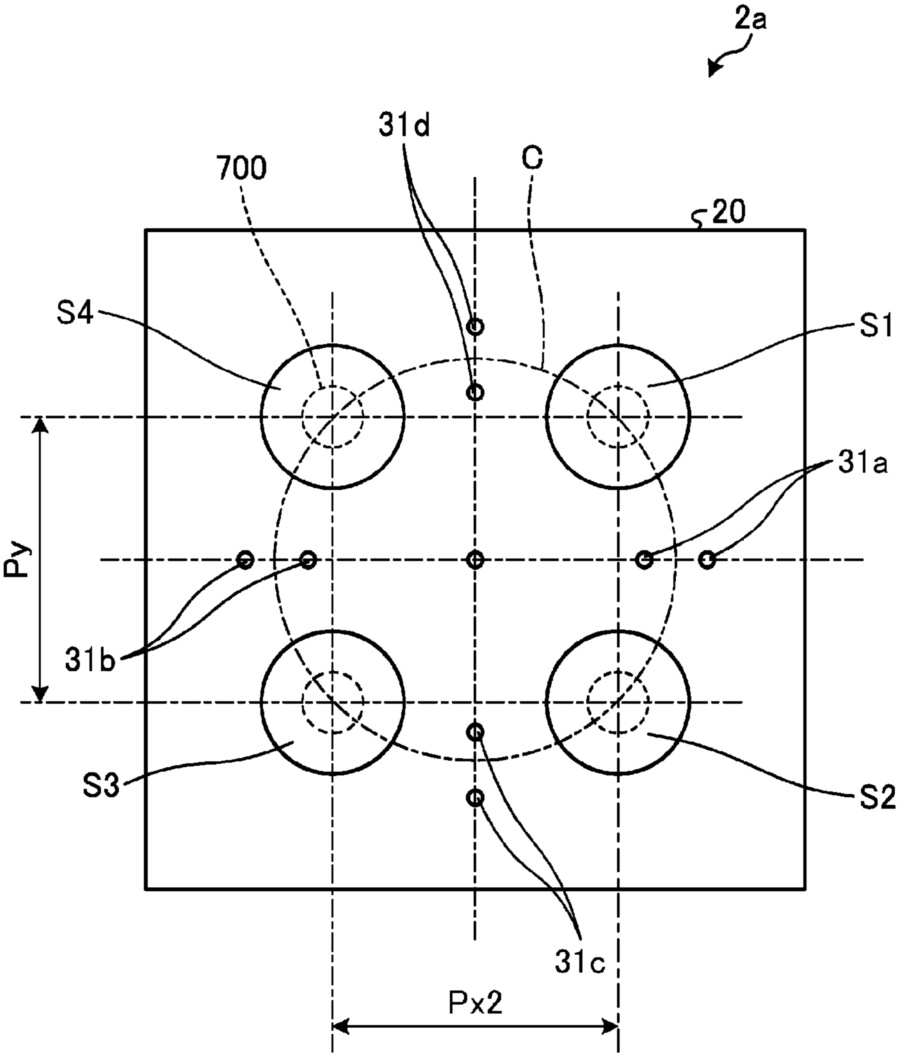
FIG. 6 is a diagram illustrating an example of sensor arrangement positions.

In addition, the arrangement positions of the sensors 31*a* and 31*b* are not limited to the X direction as long as they are on the straight line passing through the center of the substrate processing apparatus 2. Further, in the substrate processing apparatus 2*a* in which the Y-direction pitch (row distance) denoted as the pitch Py and the X-direction pitch (column distance) denoted as the pitch Px2 for the stages 22 are the same, the sensors may be arranged on the X-direction straight line or the Y-direction straight line passing through the center of the substrate processing apparatus 2*a*. FIG. 6 is a diagram illustrating an example of the arrangement positions of the sensors. The substrate processing apparatus 2*a* illustrated in FIG. 6 includes sensors 31*a* to 31*d* arranged respectively between adjacent processing spaces S1 and S2, between adjacent processing spaces S3 and S4, between adjacent processing spaces S2 and S3, and between adjacent processing spaces S4 and S1. The sensors 31*a* and 31*b* are arranged on the X-direction straight line passing through the center of the substrate processing apparatus 2*a* (the processing container 20), that is, the center position of the circumference C. The sensors 31*c* and 31*d* are arranged on the Y-direction straight line passing through the center position of the circumference C. This is to align the arrangement direction of two unit sensors of each of the sensors 31*a* to 31*d* with the thermal expansion direction of the processing container 20, thereby minimizing detection errors caused by a change in a positional relationship between the two unit sensors during the thermal expansion.

Returning to the description of FIG. 5, the substrate processing apparatus 2 may detect an amount of misalignment of each wafer W in the processing spaces S1 to S4 as transfer destinations by detecting the position of each wafer W using the sensors 31*a* and 31*b*. For example, the substrate processing apparatus 2 calculates the amount of misalignment of each wafer W based on positions of front and rear edges of each wafer W detected by the sensors 31*a* and 31*b* and an output result (rotational angle of the wafer W) of an encoder (not illustrated) provided on the rotary arm 3. The amount of misalignment of each wafer W may be calculated by using, for example, a mathematical model capable of calculating the amount of misalignment from the positions of the front and rear edges of each wafer W and the rotational angle of each wafer W.

In the example of FIG. 5, Position P24 indicates a state where the rear edge of the wafer W has passed through the sensor 31*b* when transferred from the processing space S2 to the processing space S4, and Position P42 indicates a state where the rear edge of the wafer W has passed through the sensor 31*a* when transferred from the processing space S4 to the processing space S2. For example, when the rear edge of the wafer W passes through the sensor 31*b*, the substrate processing apparatus 2 calculates the amount of misalignment of the wafer W in the processing space S4 as a transfer destination, based on the position of the rear edge of the wafer W detected by the sensor 31*b* and the result outputted from the encoder. Further, for example, when the front edge of the wafer W passes through the sensor 31*b*, the substrate processing apparatus 2 may calculate the amount of misalignment of the wafer W in the processing space S4 as a transfer destination, based on the position of the front edge of the wafer W detected by the sensor 31*b* and the result outputted from the encoder. Further, for example, the substrate processing apparatus 2 may calculate an average value of the amount of misalignment of the wafer W detected when the rear edge of the wafer W passes through the sensor 31*b* and the amount of misalignment of the wafer W detected when the front side of the wafer W passes through the sensor 31*b*.

Further, the substrate processing apparatus 2 may correct the misalignment of the wafer W by moving each stage 22 within at least the XY plane in the processing spaces S1 to S4 as transfer destinations, based on the detected amount of misalignment of the wafer W during the transfer of the wafer W by the rotary arm 3. Specifically, the substrate processing apparatus 2 includes an adjustment mechanism 700 configured to adjust the position of each stage 22, and may control the adjustment mechanism 700 to move each stage 22 based on the detected amount of misalignment, thereby correcting the misalignment of the wafer W. In other words, the substrate processing apparatus 2 adjusts the misalignment such that the wafer W is located at the center of the processing spaces S1 to S4 when the stage 22 is moved upward.

The adjustment mechanism 700 and the sensors 31*a* and 31*b* are fixed to an outer surface of a bottom 27 (see FIG. 13) of the processing container 20. This is to prevent a change in the positional relationship between the adjustment mechanism 700 and the sensors 31*a* and 31*b* due to the thermal expansion of the processing container 20 by fixing both the adjustment mechanism 700 and the sensors 31*a* and 31*b* to the processing container 20, which is a common member.

Figure 7:
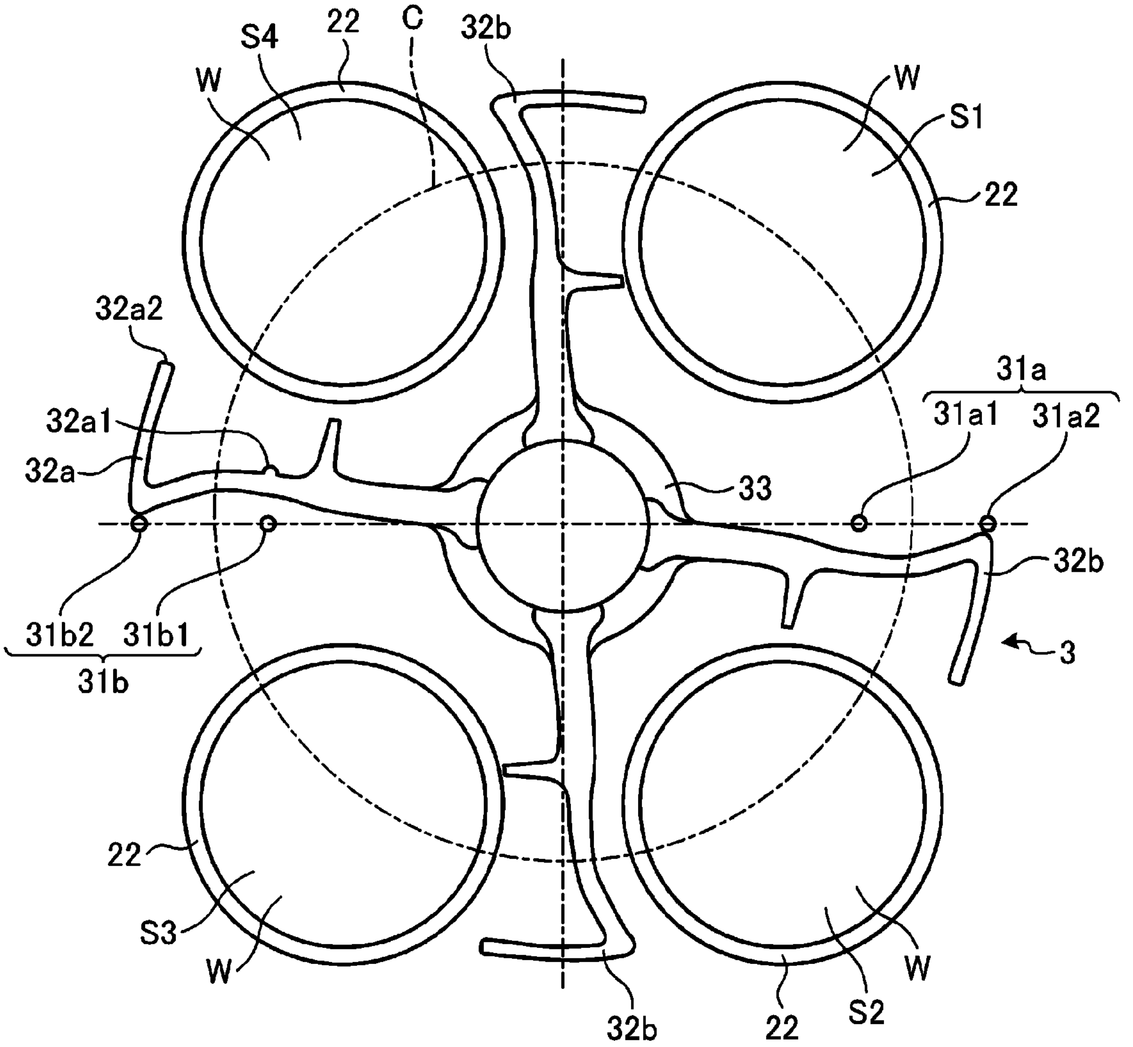
FIG. 7 is a diagram illustrating an example of a positional relationship between sensors and each end effector.

Next, the alignment (teaching) of the end effector 32 will be described. FIG. 7 is a diagram illustrating an example of a positional relationship between sensors and each end effector. In addition, in FIGS. 7 to 11, for each end effector 32 of the rotary arm 3, one end effector 32*a* that serves as a reference when used for alignment may be described to distinguish from the other end effectors 32*b*. FIG. 7 illustrates a state where each end effector 32 is illustrated at the standby position between the stages 22, similarly to FIG. 4. Further, in FIGS. 7 to 11, a case where the end effector 32*a* is aligned with the delivery position of the wafer W in the processing space S4, will be described by way of example.

The sensors 31*a* and 31*b* detect the position of the wafer W as described above, but are used to detect the position of the end effector 32*a* when the alignment of the end effector 32 is performed. As illustrated in FIG. 7, the sensors 31*a* and 31*b* include a set of sensors 31*al* and 31*a*2 and a set of sensors 31*b*1 and 31*b*2, respectively. The sensors 31*al* and 31*b*1 are an example of first sensors located on an inner peripheral side. The sensors 31*a*2 and 31*b*2 are an example of second sensors located on an outer peripheral side. During alignment, the sensors 31*al* and 31*b*1 detect a width of the end effector 32*a* including a protrusion 32*al* provided at a position corresponding to the sensors 31*al* and 31*b*1. In addition, the shape of protrusion 32*al* is an example of a different shape. The protrusion 32*al* may have a shape, such as a triangular shape, trapezoidal shape, or semicircle shape, in which the width of the end effector 32*a* varies between the center and other portions such as oblique sides. In the following description, a case where the alignment for the end effector 32*a* is performed using the sensors 31*b*1 and 31*b*2 will be described, but the alignment may be performed for the processing space S2 by rotating the rotary arm 3 by 180 degrees and using the sensors 31*al* and 31*a*2. Further, four end effectors 32 may have different shapes in which signals detected by the sensors 31*al* and 31*b*1 are different from each other at positions corresponding to the respective sensors 31*al* and 31*b*1.

Figure 8:
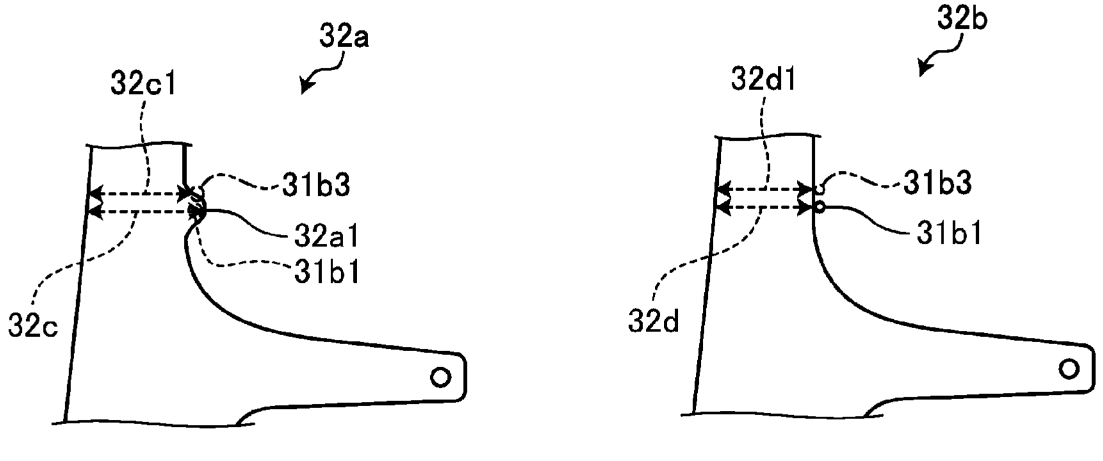
FIG. 8 is a diagram illustrating an example where shapes of a reference end effector and other end effectors at the position corresponding to the sensor are different from each other.

FIG. 8 is a diagram illustrating an example where shapes of a reference end effector and other end effectors at the position corresponding to the sensor are different from each other. As illustrated in FIG. 8, the end effector 32*a* is provided with the protrusion 32*al* at a position corresponding to the sensor 31*b*1 and has a shape in which a width at that position is increased. On the other hand, the end effector 32*b* has no portion corresponding to the protrusion 32*al* at a position corresponding to the sensor 31*b*1 and has a shape in which front and rear positions and widths in a longitudinal direction are substantially identical to each other. The protrusion 32*al* of the end effector 32*a* is at a position where the top thereof matches the sensor 31*b*1 at room temperature. In this case, a signal detected by the sensor 31*b*1 corresponds to a width 32*c*. On the other hand, at a position of the end effector 32*b* corresponding to the sensor 31*b*1, a signal detected by the sensor 31*b*1 at room temperature corresponds to a width 32*d*.

Figure 9:
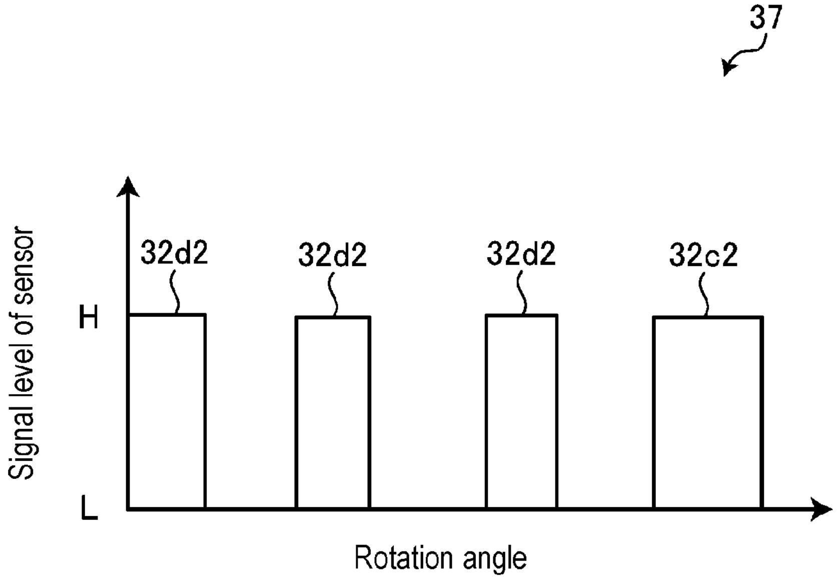
FIG. 9 is a timing chart illustrating an example of a signal detected by the sensor depending on a rotational angle of the rotary arm.

FIG. 9 is a timing chart illustrating an example of a signal detected by the sensor depending on the rotational angle of the rotary arm. A timing chart 37 illustrated in FIG. 9 represents a level of the signal detected by the sensor 31*b*1 when the rotary arm 3 is rotated by 360 degrees. In addition, in the timing chart 37, the rotational speed of the rotary arm 3 is kept constant. Further, the timing chart 37 represents a positive logic where a detection time and a non-detection time of the end effectors 32*a* and 32*b* are denoted as H and L, respectively, but a negative logic may also be used. The sensor 31*b*1 generates a detection signal 32*c*2 corresponding to the width 32*c* of the end effector 32*a* and a detection signal 32*d*2 corresponding to the width 32*d* of the end effector 32*b* based on the rotational angle of the rotary arm 3. In the example of the timing chart 37, the signal 32*c*2 has a longer detection time H (larger rotational angle) than the signal 32*d*2, which makes it possible to specify the end effector 32*a*. In other words, the controller 8 may specify the end effector 32*a* because the signals detected depending on the presence or absence of the protrusion 32*al* are different from each other.

Returning to the description of FIG. 8, a case where the interior of the processing container 20 is increased in temperature will be described. During such a temperature increase, the processing container 20 thermally expands outward from the center in a uniform manner. Thus, the sensor 31*b*1 fixed to the processing container 20 is also shifted outward. For the sake of convenience in description, the sensor 31*b*1 shifted during the temperature increase is referred to as sensor 31*b*3. Since the end effector 32*a* is made of a material (for example, alumina) with a significantly smaller expansion rate than that of the processing container 20 and is rotatably held around the center of the circumference C as a rotational axis within the processing container 20, the sensor 31*b*3 fixed to the processing container 20 has a changed positional relationship with respect to the end effector 32*a*. Accordingly, the oblique side of the protrusion 32*al* of the end effector 32*a* comes to correspond to the sensor 31*b*3. In this case, a signal detected by the sensor 31*b*3 corresponds to a width 32*cl*. Similarly, a positional relationship between the end effector 32*b* and the sensor 31*b*3 is changed, and a signal detected by the sensor 31*b*3 corresponds to a width 32*d*1. Even during the temperature increase, times required to detect the signals corresponding to the width 32*cl* and the width 32*dl* are different from each other, which makes it possible to specify the end effector 32*a*.

Further, the controller 8 may detect an expansion rate of the processing container 20 by comparing the signal corresponding to the width 32*c* at room temperature with the signal corresponding to the width 32*cl* during the temperature increase, and may reflect the detected expansion rate in the transfer accuracy of the wafer W. For example, the controller 8 may move the stage 22 based on the detected expansion rate, and use the detected expansion rate to align the center of the wafer W with the center of the stage 22. In addition, a position of a tip 32*a*2 of the end effector 32*a* is changed in the longitudinal direction of the end effector 32*a* relative to the sensor 31*b*2 shifted during the temperature increase, but is not changed in the rotational direction of the rotary arm 3. In other words, the sensor 31*b*1 detects the end effector 32 and the thermal expansion, while the sensor 31*b*2 detects the position of the end effector 32 in the rotational direction.

Figure 10:
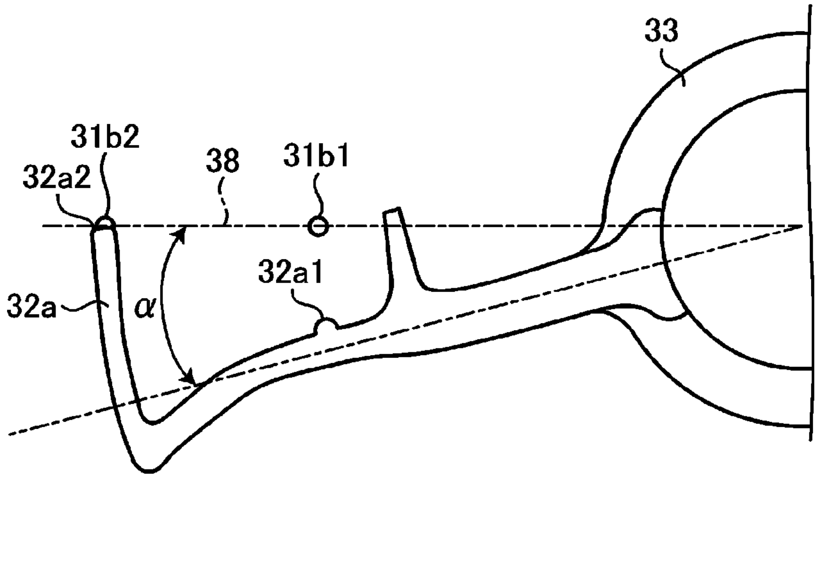
FIG. 10 is a diagram illustrating an example of a reference position of the reference end effector.

Next, a reference position of the end effector 32*a* in the rotational direction will be described. FIG. 10 is a diagram illustrating an example of the reference position of the reference end effector. In FIG. 10, the rotary arm 3 is rotated clockwise by less than about one rotation from the standby position, such that the tip 32*a*2 of the end effector 32*a* reaches the sensor 31*b*2. The controller 8 latches (memorizes) the output result (rotational angle) of the encoder (not illustrated) provided on the rotary arm 3 at the timing when the tip 32*a*2 of the end effector 32*a* is detected by the sensor 31*b*2. In the example of FIG. 10, a line 38, which passes through the sensors 31*b*1 and 31*b*2 from the center of the rotary arm 3 (the center of the circumference C in FIG. 7) at this time, becomes the reference position of the end effector 32*a* at the rotational angle. In other words, the controller 8 specifies the reference position of the end effector 32*a* based on the tip 32*a*2 of the end effector 32*a* detected by the sensor 31*b*2 and the output result (rotational angle) of the encoder (not illustrated) provided on the rotary arm 3. Further, in the present embodiment, an angle formed between the line 38 and the central axis of the end effector 32*a* at the reference position is denoted as angle $\alpha$. The angle $\alpha$ is a predetermined angle based on the shape of the end effector 32*a* and is stored in advance in the controller 8.

Figure 11:
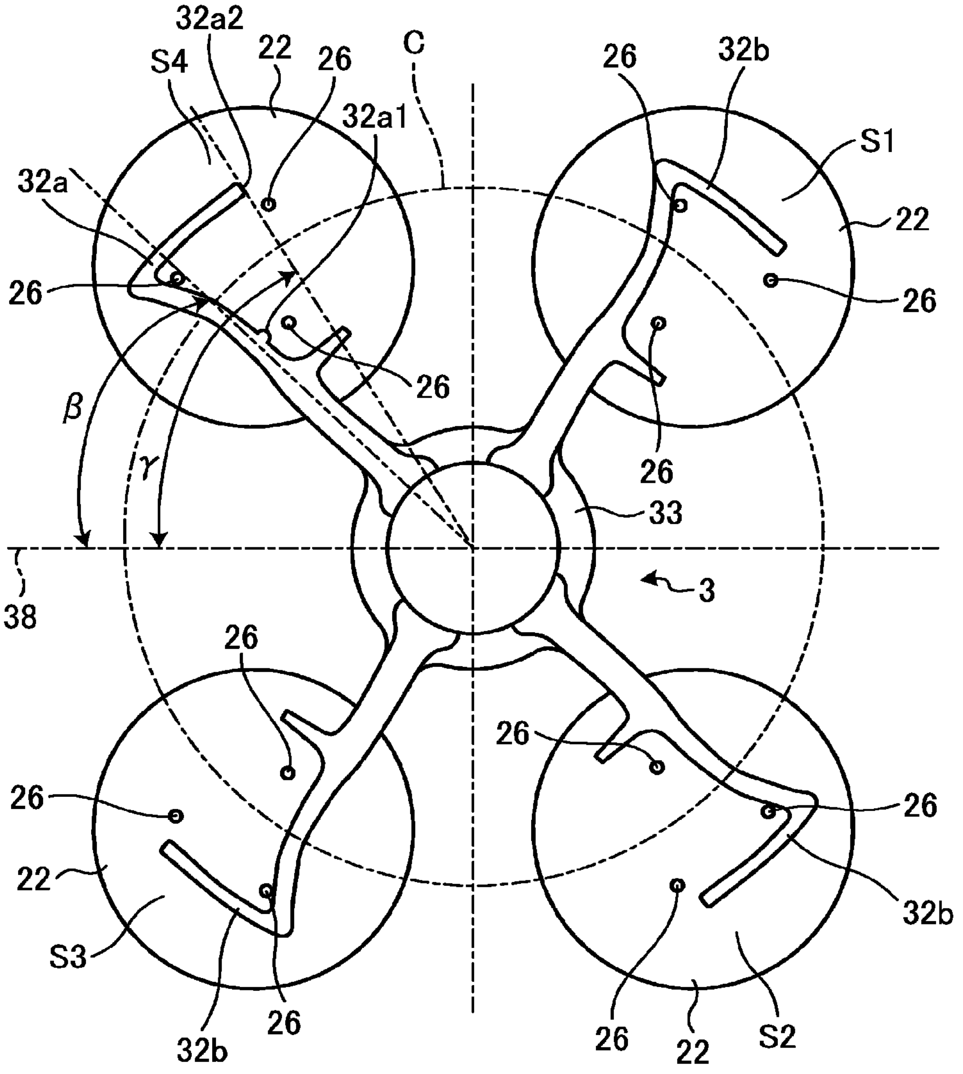
FIG. 11 is a diagram illustrating an example of a rotational angle with respect to a reference processing space.

FIG. 11 is a diagram illustrating an example of the rotational angle with respect to the processing space as a reference. In FIG. 11, the end effector 32*a* is rotated clockwise by an angle $\gamma$ from the line 38 as a reference position and is moved to the wafer delivery position between the end effector 32*a* and the stage 22 in the processing space S4. At this time, an angle $\beta$ between the central axis of the end effector 32*a* and the line 38 as the reference position is a predetermined angle based on the arrangement of the processing space S4 in the processing container 20 and is stored in advance in the controller 8. In other words, the controller 8 may move the end effector 32*a* to the wafer delivery position between the end effector 32*a* and the stage 22 in the processing space S4 by rotating the end effector 32*a* clockwise by the sum of the angle $\alpha$ and the angle $\beta$ after the tip 32*a*2 of the end effector 32*a* is detected by the sensor 31*b*2. In addition, the controller 8 may rotate the end effector 32*a* clockwise by the angle $\gamma$ after the tip 32*a*2 is detected by the sensor 31*b*2. In this case as well, the controller 8 may move the end effector 32*a* to the wafer delivery position between the end effector 32*a* and the stage 22 in the processing space S4. Further, since the end effectors 32*a* and 32*b* are assembled to the base member 33 of the rotary arm 3 with high precision, when the alignment of the end effector 32*a* in the processing space S4 is completed, the alignment of the other end effectors 32*b* in the processing spaces S1 to S3 is also completed. Moreover, the end effectors 32*a* and 32*b* and the lift pins 26 are in a positional relationship in which they do not interfere with each other at the delivery positions in the processing spaces S1 to S4.

In addition, the controller 8 may use the sensors 31*a* and 31*b* to confirm the position of each end effector 32 even during an actual process after the completion of alignment. In addition, the controller 8 may rotate the rotary arm 3 by 360 degrees at an arbitrary timing and use the sensors 31*a* and 31*b* to confirm the position of each end effector 32. For example, the controller 8 may reflect the thermal expansion in the transfer accuracy of the wafer W based on the confirmation result, or may detect damage to the end effector 32 when the end effector 32 to be detected is not detected.

Further, the controller 8 may diagnose or predict the wear and degradation of a drive system (such as 2-axis vacuum seal 34 to be described later) of the rotary arm 3 by comparing the result outputted from the encoder when the tip 32*a*2 is detected by the sensor 31*b*2 with the result outputted from the encoder during alignment. For example, when the result outputted from the encoder upon the detection of the tip 32*a*2 by the sensor 31*b*2 has a larger value than the result outputted from the encoder during alignment, the controller 8 may diagnose, for example, the occurrence of wear and degradation of driving parts such as gears and timing belts or the loosening of screws in mounting parts. Further, for example, when the result outputted from the encoder has a smaller value than the result outputted from the encoder during alignment, the controller 8 may diagnose, for example, the occurrence of an increase in deposits on the end effector 32 or the loosening of screws in the mounting parts.

In addition, in a case where the sensors 31*a* and 31*b* are optical sensors, when deposits are accumulated in the interior of the processing container 20, the deposits may also adhere to a transparent window. This reduces the intensity of light. Thus, the controller 8 may use the intensity of light as an indicator for cleaning the interior of the processing container 20. Further, response times of the sensors 31*a* and 31*b* may be delayed due to such a reduction in the intensity of light of the sensors 31*a* and 31*b*. Thus, the controller 8 may similarly use the response time as an indicator of a cleaning time by comparing the result outputted from the encoder upon the detection of the tip with the result outputted from the encoder during alignment.

Figure 12:
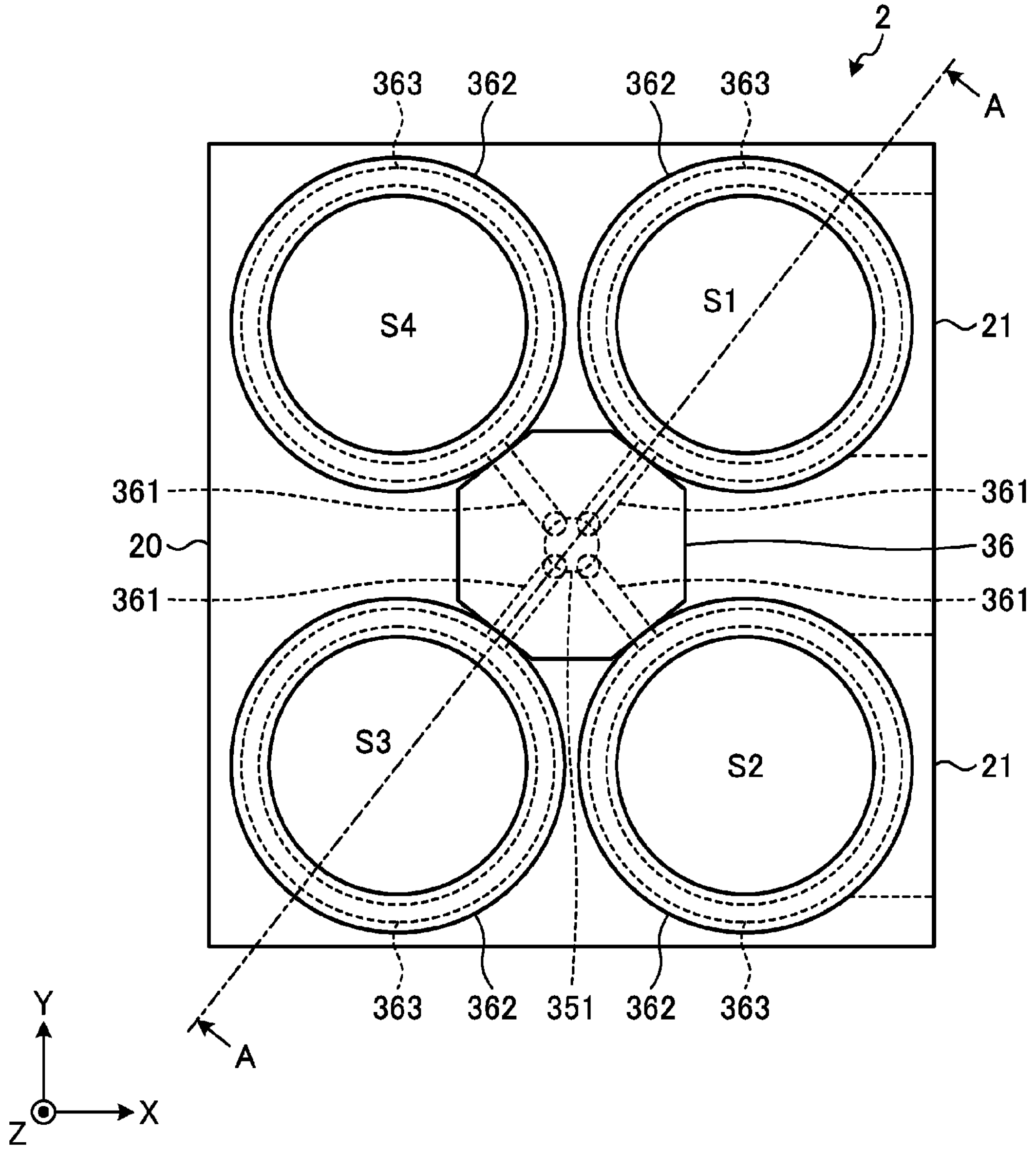
FIG. 12 is a diagram illustrating an example of an exhaust path of the substrate processing apparatus according to the present embodiment.

FIG. 12 is a diagram illustrating an example of an exhaust path of the substrate processing apparatus according to the present embodiment. FIG. 12 illustrates the processing container 20 except for the gas supplier 4 (to be described later) when viewed from the top. As illustrated in FIG. 12, the manifold 36 is located at the center of the substrate processing apparatus 2. The manifold 36 includes a plurality of exhaust passages 361 connected to the processing spaces S1 to S4. Each exhaust passage 361 is connected to a hole 351 of a thrust nut 35, which will be described later, below the center of the manifold 36. Each exhaust passage 361 is also connected to an annular flow path 363 within each guide member 362 provided above the processing spaces S1 to S4. In other words, gases in the processing spaces S1 to S4 are exhausted to a junction exhaust port 205 (to be described later) via the flow path 363, exhaust passage 361, and the hole 351.

Figure 13:
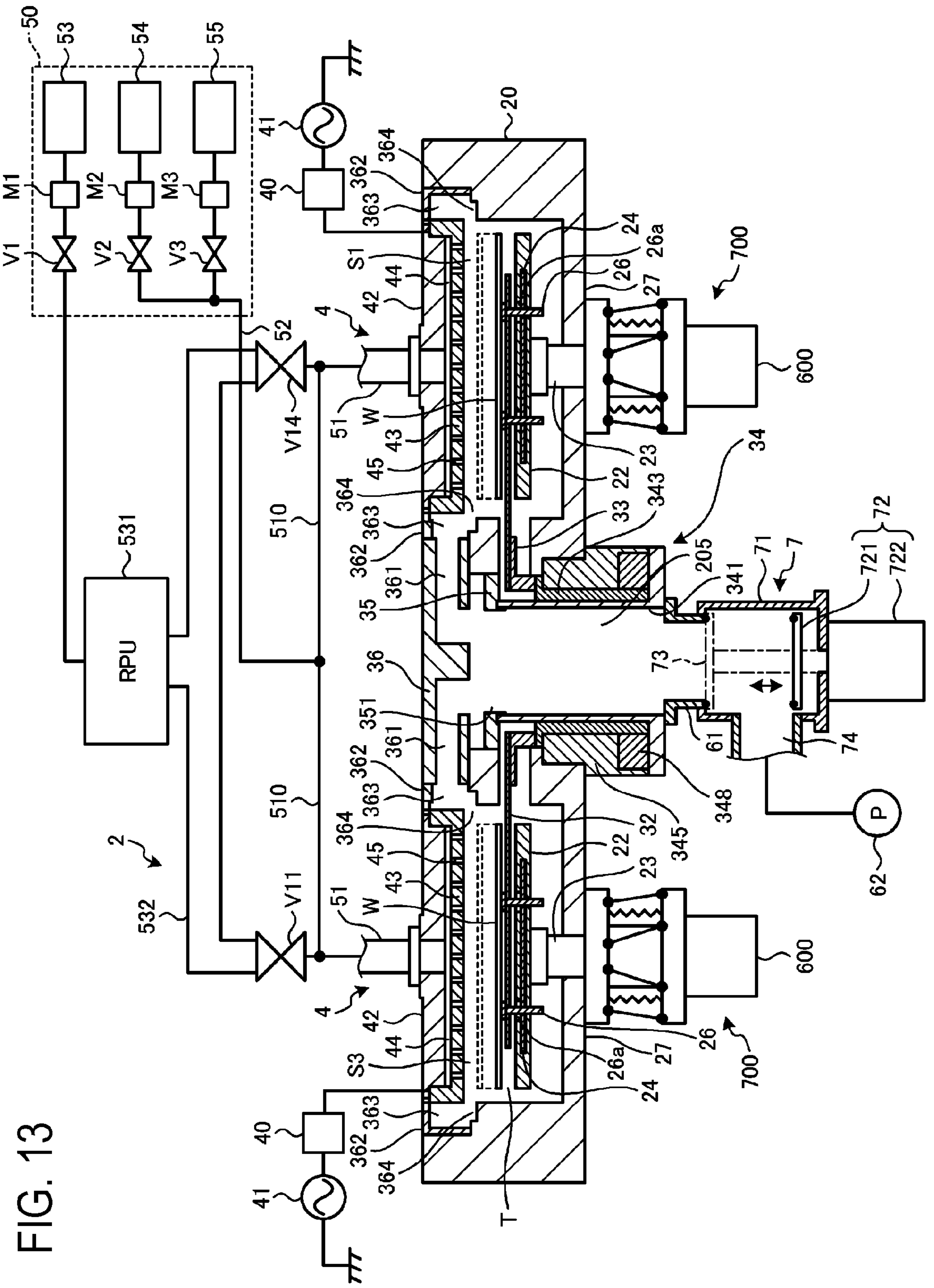
FIG. 13 is a schematic cross-sectional view illustrating an example of a configuration of the substrate processing apparatus according to the present embodiment.

FIG. 13 is a schematic cross-sectional view illustrating an example of a configuration of the substrate processing apparatus according to the present embodiment. The cross section of FIG. 13 corresponds to the cross section taken along line A-A of the substrate processing apparatus 2 illustrated in FIG. 12. The four processing spaces S1 to S4 are configured similarly to each other, and are defined respectively between the stage 22 on which the wafer W is placed and the gas supplier 4 disposed to face the stage 22. In other words, the stage 22 and the gas supplier 4 are provided within the processing container 20 for each of the four processing spaces S1 to S4. FIG. 13 illustrates the processing spaces S1 and S3. The following description will be focused on the processing space S1 by way of example.

The stage 22 also serves as a lower electrode, and is formed, for example, in a flat cylindrical shape made of a metal or aluminum nitride (AlN) with an embedded metal mesh electrode. The stage 22 is supported from below by a supporting member 23. The supporting member 23 is formed in a cylindrical shape to extend vertically downward from the stage 22 and penetrate the bottom 27 of the processing container 20. A lower end portion of the supporting member 23 is located outside the processing container 20 and is connected to a rotation drive mechanism 600. The supporting member 23 is rotated by the rotation drive mechanism 600. The stage 22 is configured to be rotatable with the rotation of the supporting member 23. Further, the adjustment mechanism 700 is provided at the lower end portion of the supporting member 23 to adjust a position and inclination of the stage 22. The adjustment mechanism 700 is fixed, along with the sensors 31*a* and 31*b* (see FIG. 5), to an outer surface of the bottom 27 of the processing container 20.

The stage 22 is configured to be vertically movable between the processing position and the delivery position via the supporting member 23 by the adjustment mechanism 700. In FIG. 13, the solid line represents the stage 22 at the delivery position, and the dashed line represents the stage 22 at the processing position. Further, at the delivery position, the end effector 32 of the rotary arm 3 is inserted between the stage 22 and the wafer W to receive the wafer W from the lift pins 26. In addition, the processing position is a position during the execution of substrate processing (for example, film formation), while the delivery position is a position at which the wafer W is delivered between the substrate transfer mechanism 15*a* and the end effector 32. A movement path (for example, path F2 in FIG. 5) of the wafer W held by the rotary arm 3 is located closer to the bottom 27 of the processing container 20 than the processing position. This allows the wafer W to be brought closer to the sensors 31*a* and 31*b* located on the outer surface of the bottom 27 of the processing container 20 during the transfer of the wafer W by the rotary arm 3, which makes it possible to improve the detection accuracy of the sensors 31*a* and 31*b*.

A heater 24 is embedded in the stage 22. The heater 24 heats each wafer W placed on the stage 22 in a range of, for example, approximately 60 degrees C. to 600 degrees C. Further, the stage 22 is connected to a ground potential.

Further, the stage 22 is provided with a plurality of (for example, three) pin through-holes 26*a*, and the lift pins 26 are located within the respective pin through-holes 26*a*. The pin through-holes 26*a* are formed to extend from a placement surface (upper surface) to a back surface (lower surface) opposite to the placement surface. Each lift pin 26 is slidably inserted into the pin through-hole 26*a*. Upper ends of lift pins 26 are suspended from the placement surface side of the pin through-hole 26*a*. In other words, the upper ends of the lift pins 26 have a larger diameter than the pin through-hole 26*a*, and the pin through-hole 26*a* is formed at an upper end thereof with a recess, which has a larger diameter and thickness than the upper end of the lift pin 26 and may accommodate the upper end of the lift pin 26. Thus, the upper ends of the lift pins 26 are locked to the stage 22 and be suspended from the placement surface side of the pin through-hole 26*a*. Further, lower ends of the lift pins 26 protrude from the back surface of the stage 22 toward the bottom 27 of the processing container 20.

In a state where the stage 22 is moved upward to the processing position, the upper ends of the lift pins 26 are accommodated in the recess on the placement surface side of the pin through-hole 26*a*. When the stage 22 is moved downward to the delivery position from this state, the lower ends of the lift pins 26 come into contact with the bottom 27 of the processing container 20 so that the lift pins 29 moves into the pin through-holes 26*a*. Thus, as illustrated in FIG. 13, the upper ends of the lift pins 26 protrude from the placement surface of the stage 22. In addition, in this case, the lower ends of the lift pins 26 may be brought into contact with, for example, a lift pin contact member located on the bottom side, rather than the bottom 27 of the processing container 20.

The gas supplier 4 is provided above the stage 22 in a ceiling portion of the processing container 20 via the guide member 362 made of an insulating member. The gas supplier 4 functions as an upper electrode. The gas supplier 4 includes a cover 42, a shower plate 43 having a surface facing the placement surface of the stage 22, and a gas flow chamber 44 formed between the cover 42 and the shower plate 43. The cover 42 is connected to a gas supply pipe 51, and the shower plate 43 has gas discharge holes 45, which are formed in the thickness direction and are arranged, for example, in both longitudinal and transverse directions. Gases are discharged from the shower plate 43 toward the stage 22 in the form of a shower.

Each gas supplier 4 is connected to a gas supply system 50 via the gas supply pipe 51. The gas supply system 50 includes, for example, sources of processing gases such as a reaction gas (film forming gas), a purge gas, and a cleaning gas, pipes, valves V, flow rate adjusters M and the like. The gas supply system 50 includes, for example, a cleaning gas source 53, a reaction gas source 54, a purge gas source 55, valves V1 to V3 provided in the pipes of the respective sources, and flow rate adjusters M1 to M3.

The cleaning gas source 53 is connected to a cleaning gas supply path 532 via the flow rate regulator M1, the valve V1, and a remote plasma unit (RPU) 531. The cleaning gas supply path 532 is divided into four branches on the downstream side of the RPU 531, and each branch is connected to the gas supply pipe 51. Valves V11 to V14 are provided for each branch on the downstream side of the RPU 531. During cleaning, the corresponding valves V11 to V14 are opened. In addition, for the sake of convenience in illustration, only valves V11 and V14 are illustrated in FIG. 13.

The reaction gas source 54 and the purge gas source 55 are connected to a gas supply path 52 via the flow rate adjusters M2 and M3 and the valves V2 and V3, respectively. The gas supply path 52 is connected to the gas supply pipe 51 via a gas supply pipe 510. In addition, in FIG. 13, the gas supply path 52 and the gas supply pipe 510 represent a collective depiction of supply paths and a collective depiction of supply pipes, which correspond to each gas supplier 4, respectively.

A radio-frequency power supply 41 is connected to the shower plate 43 via a matcher 40. The shower plate 43 functions as an upper electrode which faces the stage 22. When radio frequency power is applied between the shower plate 43 serving as an upper electrode and the stage 22 serving as a lower electrode, the gas (the reaction gas in this example) supplied from the shower plate 43 to the processing space S1 may be plasmarized.

Next, an exhaust path from the processing spaces S1 to S4 to the junction exhaust port 205 will be described. As illustrated in FIGS. 12 and 13, the exhaust path passes through each exhaust passage 361 from the annular flow path 363 in each guide member 362 provided above the processing spaces S1 to S4, and then goes to the junction exhaust port 205 via the hole 351 at a junction portion below the center of the manifold 36. In addition, the exhaust passage 361 has a cross section formed in, for example, a circular shape.

The guide member 362 for exhaust is provided around each of the processing spaces S1 to S4 to surround the corresponding processing space S1, S2, S3 or S4. The guide member 362 is an annular body provided to surround, for example, the area around the stage 22 at the processing position at a distance from the stage 22. The guide member 362 is configured, for example, to internally form the flow path 363, which has a rectangular longitudinal cross-section and has an annular shape in a plan view. FIG. 12 schematically illustrates the processing spaces S1 to S4, the guide members 362, the exhaust passages 361, and the manifold 36.

The guide member 362 has an exhaust slit 364 that is open to the processing spaces S1 to S4. The exhaust slit 364 is formed in a circumferential direction around each of the processing spaces S1 to S4. The exhaust passage 361 is connected to the flow path 363, and the processing gases exhausted from the exhaust slit 364 flow toward the hole 351 at the junction portion below the center of the manifold 36.

As illustrated in FIG. 12, sets of the processing spaces S1 and S2 and the processing spaces S3 and S4 are arranged to surround the manifold 36 in a 180-degrees rotational symmetry relationship when viewed from the top side. Thus, the flow paths of the processing gases from the respective processing spaces S1 to S4 to the hole 351 via the exhaust slits 364, the flow paths 363 of the guide members 362, and the exhaust passages 361 are formed in a 180-degrees rotational symmetry relationship around the hole 351.

The hole 351 is connected to an exhaust pipe 61 via the junction exhaust port 205 inside a thrust pipe 341 of the 2-axis vacuum seal 34 located at the center of the processing container 20. The exhaust pipe 61 is connected to a vacuum pump 62, which constitutes a vacuum exhaust mechanism, via a valve mechanism 7. For example, one vacuum pump 62 is provided for each processing container 20, and exhaust pipes on the downstream side of the respective vacuum pumps 62 are joined and connected to, for example, a factory exhaust system.

The valve mechanism 7 serves to open and close the flow path of the processing gases formed in the exhaust pipe 61, and includes, for example, a casing 71 and a shutter 72. A first opening 73 connected to the exhaust pipe 61 provided on the upstream side is formed in an upper surface of the casing 71, and a second opening 74 connected to a downstream side exhaust pipe is formed in a side surface of the casing 71.

The shutter 72 includes, for example, an opening/closing valve 721 having a size for blocking the first opening 73 and a lifter 722 provided outside the casing 71 to vertically move the opening/closing valve 721 within the casing 71. The opening/closing valve 721 is configured to be vertically movable between a closing position where it blocks the first opening 73 (as represented by the one-dot dashed line in FIG. 13) and an opening position where it retracts downward from the first and second openings 73 and 74 (as represented by the solid line in FIG. 13). When the opening/closing valve 721 is at the closing position, a downstream end of the junction exhaust port 205 is closed to stop the exhaust of the interior of the processing container 20. Further, when the opening/closing valve 721 is at the opening position, the downstream end of the junction exhaust port 205 is opened to exhaust the interior of the processing container 20.

Next, the 2-axis vacuum seal 34 and the thrust nut 35 will be described. The 2-axis vacuum seal 34 includes the thrust pipe 341, a rotor 343, a main body 345, and a direct drive motor 348. In addition, in FIG. 13, the illustration of a bearing of the 2-axis vacuum seal 34 and a magnetic fluid seal is omitted.

The thrust pipe 341 is a non-rotating central shaft, and supports the thrust load applied to a central upper portion of the substrate processing apparatus 2 through the thrust nut 35. In other words, when the processing spaces S1 to S4 are under the vacuum atmosphere, the thrust pipe 341 supports the vacuum load applied to a central portion of the substrate processing apparatus 2, thereby preventing deformation of the upper portion of the substrate processing apparatus 2. Further, the thrust pipe 341 has a hollow structure, and the interior thereof forms the junction exhaust port 205. An upper surface of the thrust pipe 341 comes into contact with a lower surface of the thrust nut 35. Further, a space between an upper inner surface of the thrust pipe 341 and an outer surface of a convex portion on the inner peripheral side of the thrust nut 35 is sealed with an O-ring (not illustrated).

An outer peripheral surface of the thrust nut 35 has a screw structure so that the thrust nut 35 is screwed to a partition at the central portion of the processing container 20. The manifold 36 is located above the central portion of the processing container 20. The thrust load is supported by the manifold 36, the partition at the central portion of the processing container 20, the thrust nut 35, and the thrust pipe 341.

The rotor 343 is arranged concentrically with the thrust pipe 341 and serves as a rotational shaft at the center of the rotary arm 3. Further, the rotor 343 is connected to the base member 33. As the rotor 343 rotates, the rotary arm 3, that is, the end effectors 32 and the base member 33 rotate.

The main body 345 stores the rotor 343 and the direct drive motor 348 therein. The direct drive motor 348 is connected to the rotor 343 and rotates the rotary arm 3 by driving the rotor 343.

As described above, in the 2-axis vacuum seal 34, the thrust pipe 341, which is the non-rotating center shaft as a first shaft, functions as a gas exhaust pipe while supporting the weight of the upper portion of the processing container 20, and the rotor 343, which is a second shaft, serves to rotate the rotary arm 3.

[Operation of Substrate Processing Apparatus]

Figure 14:
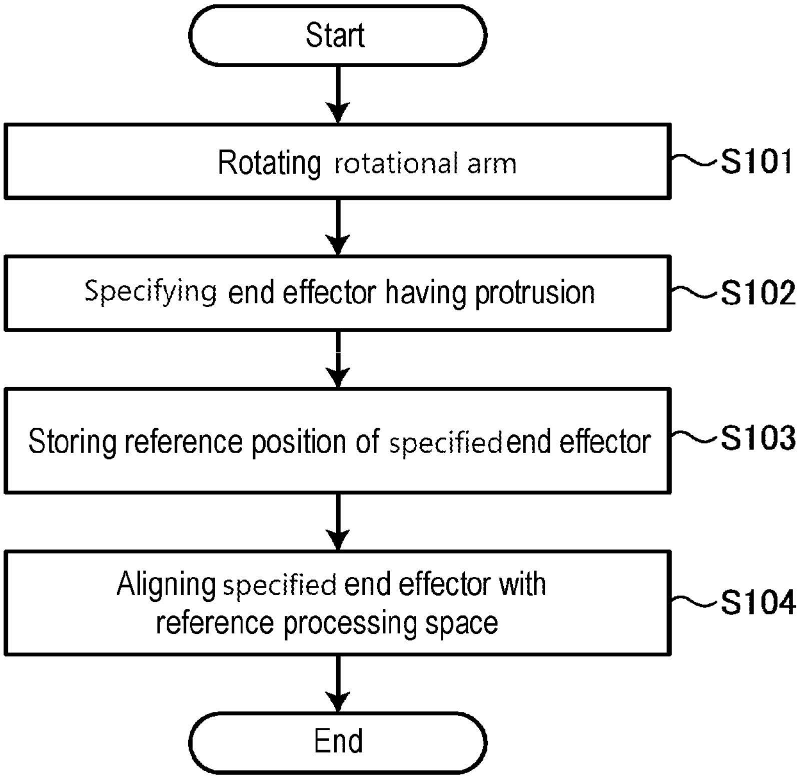
FIG. 14 is a flowchart illustrating an example of an alignment process of the rotary arm according to the present embodiment.

Next, the operation of the substrate processing apparatus according to the embodiment will be described with reference to FIG. 14. FIG. 14 is a flowchart illustrating an example of the alignment of the rotary arm according to the present embodiment. In addition, various processes illustrated in FIG. 14 are mainly executed based on the control of the controller 8. Further, in the following description, alignment (teaching) of the specified end effector 32*a* with respect to the processing space S4 as a reference will be described as an example.

The controller 8 controls the substrate processing apparatus 2 to increase an internal temperature of the processing container 20 of the substrate processing apparatus 2 to a processing temperature for the wafer W, for example, in the range of approximately 60 degrees C. to 600 degrees C. The controller 8 controls the substrate processing apparatus 2 to rotate the rotary arm 3 clockwise by one rotation from the standby position (step S101) and to acquire detection signals from the sensors 31*b*1 and 31*b*2. In addition, the alignment may be performed with the interior of the processing container 20 kept at room temperature.

The controller 8 specifies the end effector 32*a* having the protrusion 32*al* based on the acquired signal detected by the sensor 31*b*1 when the rotary arm 3 is rotated (step S102).

The controller 8 stores a reference position of the specified end effector 32*a* (position based on the line 38 in FIG. 10) based on a position where the specified end effector 32*a* is detected by the sensor 31*b*2 (step S103). At this time, the controller 8 stores the result outputted from the encoder (output value) corresponding to the reference position in correspondence with that reference position. In other words, the controller 8 latches the output value of the encoder provided on the rotary arm 3 at the timing when the tip 32*a*2 of the end effector 32*a* is detected by the sensor 31*b*2. The controller 8 associates the output value from the encoder at the timing when the tip 32*a*2 of the end effector 32*a* is detected with the angle α based on the shape of the end effector 32*a*.

The controller 8 adds the output value from the encoder, which corresponds to the angle ß as the predetermined angle based on the arrangement of the processing space S4 in the processing container 20, and the output value from the encoder, which corresponds to the angle α. In other words, the controller 8 adds the angle α and the angle β. In addition, the controller 8 may add the output value from the encoder at the timing when the tip 32*a*2 of the end effector 32*a* is detected and the output value from the encoder, which corresponds to the angle γ as the predetermined angle based on the arrangement of the processing space S4. In other words, the controller 8 may add the angle γ to the reference position. The controller 8 controls the substrate processing apparatus 2 to rotate the rotary arm 3 clockwise by the sum of the angle α and the angle β or the angle γ, thereby aligning the specified end effector 32*a* with the reference processing space S4 among the plurality of processing spaces S1 to S4 (step S104). In other words, the controller 8 controls the substrate processing apparatus 2 to align the specified end effector 32*a* with the wafer delivery position between the specified end effector 32*a* and the stage 22 provided in the specified processing space S4 to place the wafer W thereon. In this case, the wafer delivery position is a position where the center of the wafer W coincides with the center of the stage 22. As described above, the specified end effector 32*a* is aligned with the reference processing space S4 based on the reference position and the rotational angle of the specified end effector 32*a*, which makes it possible to facilitate the alignment of the end effector 32. In other words, the teaching may be implemented in an automatic sequence even when the interior of the processing container 20 is at an increased temperature under the vacuum atmosphere.

As described above, according to the present embodiment, the processing apparatus (the substrate processing apparatus 2) includes the processing container 20, the rotary arm 3, and the sensor 31*b*. The processing container 20 is configured to include the plurality of processing spaces S1 to S4 provided therein. The rotary arm 3 is configured to include the rotational shaft located at the central portion of the processing container 20 and rotate around the rotational shaft, and include the plurality of end effectors 32 capable of holding the wafers W which is identical in number to the plurality of processing spaces S1 to S4. The sensor 31*b* is configured to detect the positions of the end effectors 32. Further, at least one end effector 32*a* among the plurality of end effectors 32 is configured such that the shape (that is, shape of the protrusion 32*a*1) thereof at the position corresponding to the sensor 31*b* is different from the shapes of the other end effectors 32*b* at the position corresponding to the sensor 31*b*. As a result, it is possible to facilitate the alignment of the end effectors 32.

Further, according to the present embodiment, the different shape includes the oblique side with respect to the thermal expansion direction of the processing container 20. Further, the signal detected by the sensor 31*b* for the at least one end effector 32*a* having the different shape changes depending on the internal temperature of the processing container 20. As a result, it is possible to detect the expansion rate of the processing container 20. Further, the detected expansion rate may be reflected in the transfer accuracy of the wafer W.

Further, according to the present embodiment, the sensor 31*b* is configured to include the first sensor (the sensor 31*b*1) and the second sensor (the sensor 31*b*2). The first sensor is located at the position where the different shape of the at least one end effector 32*a* is detected. The second sensor is located at the position where the detection signal does not change depending on the internal temperature of the processing container 20. As a result, it is possible to facilitate the alignment of the end effectors 32 at both the increased temperature and the room temperature.

Further, according to the present embodiment, two sets of end effectors, each of which includes two end effectors 32, are arranged to face each other around the rotational shaft. The distances between adjacent end effectors 32 are different from each other at the front and back sides in the rotational direction. As a result, it is possible to facilitate the alignment of the end effectors 32 with respect to the rotary arm 3 which rotates in the processing container 20 where the Y-direction pitch and the X-direction pitch for the stages 22 are different from each other and four end effectors 32 are arranged in the X-shape.

Further, according to the present embodiment, two sets of end effectors, each of which includes two end effectors 32, are arranged to face each other around the rotational shaft. The distances between adjacent end effectors 32 are identical to each other at the front and back sides in the rotational direction. As a result, it is possible to facilitate the alignment of the end effectors 32 with respect to the rotary arm 3 which rotates in the processing container 20 where the Y-direction pitch and the X-direction pitch for the stages 22 are identical to each other and four end effectors 32 are arranged in the X-shape.

Further, according to the present embodiment, the number of the at least one end effector 32*a* having the different shape is one. Further, the number of the other end effectors 32*b* is three. The shapes of the other end effectors 32*b* at the position corresponding to the sensor 31*b*1 are identical to each other. As a result, it is possible to specify the at least one end effector 32*a*.

Further, according to the present embodiment, the alignment method used in the processing apparatus includes: a)

specifying the at least one end effector 32*a* having the different shape based on the signal detected by the sensor 31*b* when the rotary arm 3 is rotated; b) storing the reference position of the specified end effector 32*a* based on the position where the specified end effector 32*a* is detected by the sensor 31*b*; and c) aligning the specified end effector 32*a* with the specified processing space S4 among the plurality of processing spaces S1 to S4 by adding or subtracting the predetermined rotational angle to and from the reference position. As a result, it is possible to facilitate the alignment of the end effectors 32.

Further, according to the present embodiment, c) above includes aligning the specified end effector 32*a* with the wafer delivery position between the specified end effector 32*a* and the stage 22 provided in the specified processing space S4 to place the wafer W thereon. As a result, it is possible to facilitate the alignment of the end effectors 32.

Further, according to the present embodiment, the delivery position is a position where the center of the wafer W coincides with the center of the stage 22. As a result, it is possible to deliver the wafer W between each stage 22 in the processing spaces S1 to S4 and each end effector 32.

Further, according to the present embodiment, a) to c) above are executed at the processing temperature for the wafer W in the processing spaces S1 to S4. As a result, it is possible to facilitate the alignment of the end effectors 32 even during the temperature increase.

The embodiments disclosed herein should be considered to be exemplary and not limitative in all respects. The above embodiments may be omitted, replaced or modified in various embodiments without departing from the scope of the appended claims and their gist.

For example, in the above embodiment, an example where the substrate processing apparatuses 2 and 2*a* perform a substrate process such as a plasma CVD process, but the technology disclosed herein may be applied to any apparatus that performs other substrate processes such as plasma etching.

Further, in the above-described embodiment, the direct drive motor 348 is used as a device for driving the rotor 343 in the 2-axis vacuum seal 34, but the technology disclosed herein is not limited thereto. For example, a pulley may be provided on the rotor 343 and may be driven by a motor provided outside the 2-axis vacuum seal 34 via a timing belt.

In addition, the present disclosure may also have the following configuration.

(1) A processing apparatus includes:

a processing container having a plurality of processing spaces formed in the processing container;

a rotary arm including a rotational shaft located at a central portion of the processing container and a plurality of end effectors configured to rotate around the rotational shaft and to hold a plurality of wafers which is equal in number to the plurality of processing spaces; and a sensor configured to detect positions of the plurality of end effectors, wherein, among the plurality of end effectors, at least one end effector at a position corresponding to the sensor has a different shape from shapes of other end effectors at the position corresponding to the sensor.

(2) In the processing apparatus of 1) above, the different shape includes an oblique side with respect to a thermal expansion direction of the processing container, and wherein a detection signal obtained by detecting the at least one end effector having the different shape by the sensor changes depending on an internal temperature of the processing container.

(3) In the processing apparatus of 2) above, the sensor includes a first sensor and a second sensor, wherein the first sensor is located at a position where the different shape of the at least one end effector is detected, and wherein the second sensor is located at a position where the detection signal does not change depending on the internal temperature of the processing container.

(4) In the processing apparatus of any one of 1) to 3) above, the plurality of end effectors includes two sets of end effectors arranged to face each other around the rotational shaft, and distances between adjacent end effectors in the plurality of end effectors are different from each other in front and back sides in a rotational direction.

(5) In the processing apparatus of any one of 1) to 3) above, the plurality of end effectors includes two sets of end effectors arranged to face each other around the rotational shaft, and distances between adjacent end effectors in the plurality of end effectors are identical to each other in front and back sides in a rotational direction.

(6) In the processing apparatus of 4) or 5) above, a number of the at least one end effector having the different shape is one, and a number of the other end effectors is three, and wherein the shapes of the other end effectors at the positions corresponding to the sensor are identical to each other.

(7) An alignment method used in a processing apparatus is provided.

The processing apparatus includes: a processing container having a plurality of processing spaces formed in the processing container; a rotary arm including a rotational shaft located at a central portion of the processing container and a plurality of end effectors configured to rotate around the rotational shaft and to hold a plurality of wafers which is equal in number to the plurality of processing spaces; and a sensor configured to detect positions of the plurality of end effectors. Among the plurality of end effectors, at least one end effector at a position corresponding to the sensor has a different shape from shapes of other end effectors at the position corresponding to the sensor.

The alignment method includes: specifying the at least one end effector having the different shape based on a detection signal detected by the sensor when the rotary arm is rotated; storing, by the specified at least one end effector, a reference position of the specified at least one end effector based on a position where the specified at least one end effector is detected by the sensor; and aligning the specified at least one end effector in a specified processing space among the plurality of processing spaces by adding or subtracting a predetermined rotational angle to and from the reference position.

(8) In the alignment method of 7) above, the aligning the specified at least one end effector includes aligning the specified at least one end effector at a delivery position where the wafer is delivered between the specified at least one end effector and a stage configured to place the wafer on the stage, which are provided in the specified processing space.

(9) In the alignment method of 8) above, the delivery position is a position where a center of the wafer coincides with a center of the stage.

(10) In the alignment method of any one of 7) to 9) above, the specifying the at least one end effector, the storing the reference position of the specified at least one end effector, and the aligning the specified at least one end effector are executed at a processing temperature at which processing on the wafer is performed in the processing spaces.

According to the present disclosure in some embodiments, it is possible to facilitate an alignment of an end effector.

While certain embodiments have been described, these embodiments have been presented by way of example only, and are not intended to limit the scope of the disclosures. Indeed, the embodiments described herein may be embodied in a variety of other forms. Further, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A processing apparatus comprising:

a processing container having a plurality of processing spaces formed in the processing container;

a rotary arm including a rotational shaft located at a central portion of the processing container and a plurality of end effectors configured to rotate around the rotational shaft and to hold a plurality of wafers which is equal in number to the plurality of processing spaces; and a sensor configured to detect positions of the plurality of end effectors, wherein, among the plurality of end effectors, at least one end effector at a position corresponding to the sensor has a different shape from shapes of other end effectors at the position corresponding to the sensor.

2. The processing apparatus of claim 1, wherein the different shape includes an oblique side with respect to a thermal expansion direction of the processing container, and wherein a detection signal obtained by detecting the at least one end effector having the different shape by the sensor changes depending on an internal temperature of the processing container.

3. The processing apparatus of claim 2, wherein the sensor includes a first sensor and a second sensor, wherein the first sensor is located at a position where the different shape of the at least one end effector is detected, and wherein the second sensor is located at a position where the detection signal does not change depending on the internal temperature of the processing container.

4. The processing apparatus of claim 1, wherein the plurality of end effectors includes two sets of end effectors arranged to face each other around the rotational shaft, and distances between adjacent end effectors in the plurality of end effectors are different from each other in front and back sides in a rotational direction.

5. The processing apparatus of claim 4, wherein a number of the at least one end effector having the different shape is one, and a number of the other end effectors is three, and wherein the shapes of the other end effectors at the positions corresponding to the sensor are identical to each other.

6. The processing apparatus of claim 1, wherein the plurality of end effectors includes two sets of end effectors arranged to face each other around the rotational shaft, and distances between adjacent end effectors in the plurality of end effectors are identical to each other in front and back sides in a rotational direction.

7. The processing apparatus of claim 6, wherein a number of the at least one end effector having the different shape is one, and a number of the other end effectors is three, and wherein the shapes of the other end effectors at the positions corresponding to the sensor are identical to each other.

8. An alignment method used in a processing apparatus, wherein the processing apparatus includes:

a processing container having a plurality of processing spaces formed in the processing container;

a rotary arm including a rotational shaft located at a central portion of the processing container and a plurality of end effectors configured to rotate around the rotational shaft and to hold a plurality of wafers which is equal in number to the plurality of processing spaces; and a sensor configured to detect positions of the plurality of end effectors, wherein, among the plurality of end effectors, at least one end effector at a position corresponding to the sensor has a different shape from shapes of other end effectors at the position corresponding to the sensor, the alignment method comprises:

specifying the at least one end effector having the different shape based on a detection signal detected by the sensor when the rotary arm is rotated;

storing, by the specified at least one end effector, a reference position of the specified at least one end effector based on a position where the specified at least one end effector is detected by the sensor; and aligning the specified at least one end effector in a specified processing space among the plurality of processing spaces by adding or subtracting a predetermined rotational angle to and from the reference position.

9. The alignment method of claim 8, wherein the aligning the specified at least one end effector includes aligning the specified at least one end effector at a delivery position where the wafer is delivered between the specified at least one end effector and a stage configured to place the wafer on the stage, which are provided in the specified processing space.

10. The alignment method of claim 9, wherein the delivery position is a position where a center of the wafer coincides with a center of the stage.

11. The alignment method of claim 10, wherein the specifying the at least one end effector, the storing the reference position of the specified at least one end effector, and the aligning the specified at least one end effector are executed at a processing temperature at which processing on the wafer is performed in the processing spaces.

12. The alignment method of claim 8, wherein the specifying the at least one end effector, the storing the reference position of the specified at least one end effector, and the aligning the specified at least one end effector are executed at a processing temperature at which processing on the wafer is performed in the processing spaces.

* * * * *